United States Patent
Hui et al.

(10) Patent No.: US 11,212,037 B2
(45) Date of Patent: Dec. 28, 2021

(54) ENHANCED INFORMATION SEQUENCES FOR POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/633,433

(22) PCT Filed: Jul. 24, 2018

(86) PCT No.: PCT/IB2018/055516
§ 371 (c)(1),
(2) Date: Jan. 23, 2020

(87) PCT Pub. No.: WO2019/021188
PCT Pub. Date: Jan. 31, 2019

(65) Prior Publication Data
US 2020/0235852 A1     Jul. 23, 2020

Related U.S. Application Data

(60) Provisional application No. 62/536,834, filed on Jul. 25, 2017, provisional application No. 62/539,361, (Continued)

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01); *H04L 1/0033* (2013.01); *H04L 1/0036* (2013.01)

(58) Field of Classification Search
CPC ... H04L 1/0033; H04L 1/0036; H04L 1/0043; H04L 1/0041; H04L 1/0054;
(Continued)

(56) References Cited

U.S. PATENT DOCUMENTS

2017/0047947 A1    2/2017   Hong et al.
2018/0248654 A1*   8/2018   Ge .................. H04L 1/0009
(Continued)

FOREIGN PATENT DOCUMENTS

WO    2017 106246 A2    6/2017

OTHER PUBLICATIONS

Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.
(Continued)

*Primary Examiner* — Shelly A Chase
(74) *Attorney, Agent, or Firm* — Baker Botts L.L.P.

(57) ABSTRACT

According to some embodiments, a method of operation of a transmit node in a wireless communication system comprises performing polar encoding of a set of K information bits to thereby generate a set of polar-encoded information bits. The K information bits are mapped to the first K bit locations in an information sequence $S_N$. The information sequence $S_N$ is a ranked sequence of N information bit locations among a plurality of input bits for the polar encoding where N is equivalent to a code length. A size of the information sequence $S_N$ is greater than or equal to K. The information sequence $S_N$ is optimized for the specific value of the code length (N). The method may further comprise transmitting the set of polar-encoded information bits.

5 Claims, 8 Drawing Sheets

Related U.S. Application Data filed on Jul. 31, 2017, provisional application No. 62/540,267, filed on Aug. 2, 2017, provisional application No. 62/541,068, filed on Aug. 3, 2017.

(58) Field of Classification Search
CPC . H04L 1/0057; H03M 13/13; H03M 13/6588; H03M 13/098; H03M 13/3738
See application file for complete search history.

(56) References Cited

U.S. PATENT DOCUMENTS

| | | | |
|---|---|---|---|
| 2018/0278268 A1* | 9/2018 | Jeong | H04L 1/0043 |
| 2020/0177309 A1* | 6/2020 | Jang | H04L 1/0057 |

OTHER PUBLICATIONS

List Decoding of Polar Codes by Ido Tai and Alexander Vardy; 2011 IEEE International Symposium on Information Theory Proceedings—2011.

3GPP TSG RAN WG1 Meeting #86; Gothenburg, Sweden; Source: Huawei, HiSilicon; Title: Polar code design and rate matching (R1-167209)—Aug. 22-26, 2016.

3GPP TSG RAN WG1 Meeting #88bis; Hangzhou, China; Source: LG Electronics; Title: Discussion of rate matching for Polar codes (R1-1707675)—May 15-19, 2017.

3GPP TSG RAN WG1 NR Ad-Hoc#2; Qingdao, P.R. China; Source: Samsung; Title: Design of Combined-and-Nested Polar Code Sequences (R1-1711822 is a revision of R1-1710749)—Jun. 27-30, 2017.

3GPP TSG-RAN WG1 #90; Prague, Czech Republic; Source: Qualcomm Incorporated; Title: Sequence construction of Polar Codes for control channel (R1-1713468)—Aug. 21-25, 2017.

PCT International Search Report for International application No. PCT/IB2018/055516—dated Nov. 14, 2018.

A Semi-Parallel Successive-Cancellation Decoder for Polar Codes by Camille Leroux et al.; IEEE Transactions on Signal Processing, vol. 61, No. 2—Jan. 15, 2013.

PCT Written Opinion of the International Searching Authority for International application No. PCT/IB2018/055516—dated Nov. 14, 2018.

* cited by examiner

Example of polar code structure with N = 8

Polar code encoder with N = 8

ENHANCED INFORMATION SEQUENCES FOR POLAR CODES

PRIORITY

This nonprovisional application is a U.S. National Stage Filing under 35 U.S.C. § 371 of international Patent Application Serial No, PCT/IB2018/055516 filed Jul. 24, 2018 and entitled "Enhanced Information Sequences For Polar Codes" which claims priority to U.S. Provisional Patent Applications Nos. 62/536,834 filed Jul. 25, 2017; 62/539,361 filed Jul. 31, 2017; 62/540267 filed Aug. 2, 2017 and 62/541,068 filed Aug. 3, 2017 all of which are hereby incorporated by reference in their entirety.

TECHNICAL FIELD

Particular embodiments are directed to wireless communications and, more particularly, to enhanced information sequences for polar codes.

INTRODUCTION

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, are a class of constructive coding schemes that achieve the symmetric capacity of the binary-input discrete memoryless channels under a low-complexity Successive Cancellation (SC) decoder. The finite-length performance of polar codes under SC, however, is not competitive compared to other modern channel coding schemes such as Low-Density Parity-Check (LDPC) codes and Turbo codes. An SC List (SCL) decoder is proposed in I. Tal and A. Vardy, "List Decoding of polar codes," Proceedings of IEEE Symp. Inf. Theory, pp. 1-5, 2011, that approaches the performance of optimal Maximum-Likelihood (ML) decoder. By concatenating a simple Cyclic Redundancy Check (CRC) coding, the performance of a concatenated polar code is competitive with that of well-optimized LDPC and Turbo codes. As a result, polar codes are being considered as a candidate for future Fifth Generation (5G) wireless communication systems.

Polar coding transforms a pair of identical binary-input channels into two distinct channels of different qualities, one better and one worse than the original binary-input channel Repeating such a pair-wise polarizing operation on a set of $N=2^n$ independent uses of a binary-input channel results in a set of $2^n$ "bit-channels" of varying qualities. Some of the bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

In general, the set of information bit locations varies with the number of channel uses, or equivalently the code length, N, as well as the number of data bits, or equivalently the number of information bit locations, K. However, with the commonly used Additive White Gaussian Noise (AWGN) channel model, for any code length N, if $K_1 < K_2$, then the information set $A_1$ with $K_1$ information bit locations is always a (proper) subset of the information set $A_2$ with $K_2$ information bit locations. As a result, with an AWGN channel, for any given code length N, the information sets for all possible number of information bit locations, K, may be specified by a ranking sequence $S_N$ of bit location indices of length N so that the first K indices in $S_N$ is the set of information bit locations if there are K data bits, for any $K \in \{1, 2, \ldots, N\}$. Such a ranking sequence $S_N$ is referred to as the information sequence, from which the locations of bit-channels for carrying any number of data bits K can be derived.

FIG. 2 illustrates the labeling of the intermediate information bits $s_{l,i}$, where $l \in \{0, 1, \ldots, n\}$ and $i \in \{0, 1, \ldots, N-1\}$ during polar encoding with N=8. The intermediate information bits are related by the following equation:

$$s_{l+1,i} = s_{l,i} \oplus s_{l,i+2^l}, \text{ for}$$

$$i \in \left\{ j \in \{0, 1, \ldots, N-1\}: \mod\left(\left\lfloor \frac{j}{2^l} \right\rfloor, 2\right) = 0 \right\} \text{ and}$$

$$l \in \{0, 1, \ldots, n-1\}, \text{ and}$$

$$s_{l+1,i+2^l} = s_{l,i+2^l}, \text{ for}$$

$$i \in \left\{ j \in \{0, 1, \ldots, N-1\}: \mod\left(\left\lfloor \frac{j}{2^l} \right\rfloor, 2\right) = 0 \right\} \text{ and}$$

$$l \in \{0, 1, \ldots, n-1\}$$

where $s_{0,i} \equiv u_i$ are the information bits and $s_{n,i} \equiv x_i$ are the code bits for $i \in \{0, 1, \ldots, N-1\}$.

SUMMARY

A main design issue of polar coding is to identify the information sequence from which the locations of bit-channels for carrying K data bits can be obtained for a given code length N. In Huawei, HiSilicon, "Polar code design and rate matching," 3GPP contribution R1-167209, September 2016, it is proposed that such an information sequence can be obtained by assigning a weight for each bit channel indexed by j based on the following polarization weight function:

$$W(j) = \sum_{i=0}^{n-1} b_i \beta^i$$

where $\beta = 2^{1/4}$ and $j = \sum_{i=0}^{n-1} b_i 2^i$ is the binary expansion of the bit-channel index j. The information sequence is obtained simply by sorting values of $W(i)$ for $i \in \{0, 1, 2, \ldots, 2^n\}$. This information sequence is referred to as the Polarization Weight (PW) sequence.

One problem with the PW sequence is that it imposes an artificial relationship among the relative reliabilities of different bit channels as dictated by the PW function. Moreover, the value of the weight β is derived assuming an SC decoder instead of an SCL decoder, which is more commonly used in practice.

In this disclosure, information sequences that are numerically optimized for some specific code length N are presented. The optimization accounts for the performance of SCL decoders of different list sizes at different operating levels of Block Error Rate (BLER) (e.g., BLER=1% or 0.1%).

According to some embodiments, a method of operation of a transmit node in a wireless communication system comprises performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise transmitting the set of polar-encoded information bits.

According to some embodiments, a transmit node comprises a polar encoder operable to perform polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The transmit node may further comprises a transmitter operable to transmit the set of polar-encoded information bits.

According to some embodiments, a method of operation of a receive node in a wireless communication system comprises performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise receiving the set of polar-encoded information bits.

According to some embodiments, a receive node comprises a polar decoder operable to perform polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The receive node may further comprise a receiver operable to receive the set of polar-encoded information bits.

Also disclosed is a computer program product. The computer program product comprises instructions stored on non-transient computer-readable media which, when executed by a processor, perform the step of performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

Another computer program product comprises instructions stored on non-transient computer-readable media which, when executed by a processor, perform the step of performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

BRIEF DESCRIPTION OF THE DRAWINGS

The accompanying drawing figures, incorporated in and forming a part of this specification, illustrate several aspects of the disclosure, and together with the description form a more complete understanding of the embodiments and their features and advantages.

DETAILED DESCRIPTION

Figure 1:
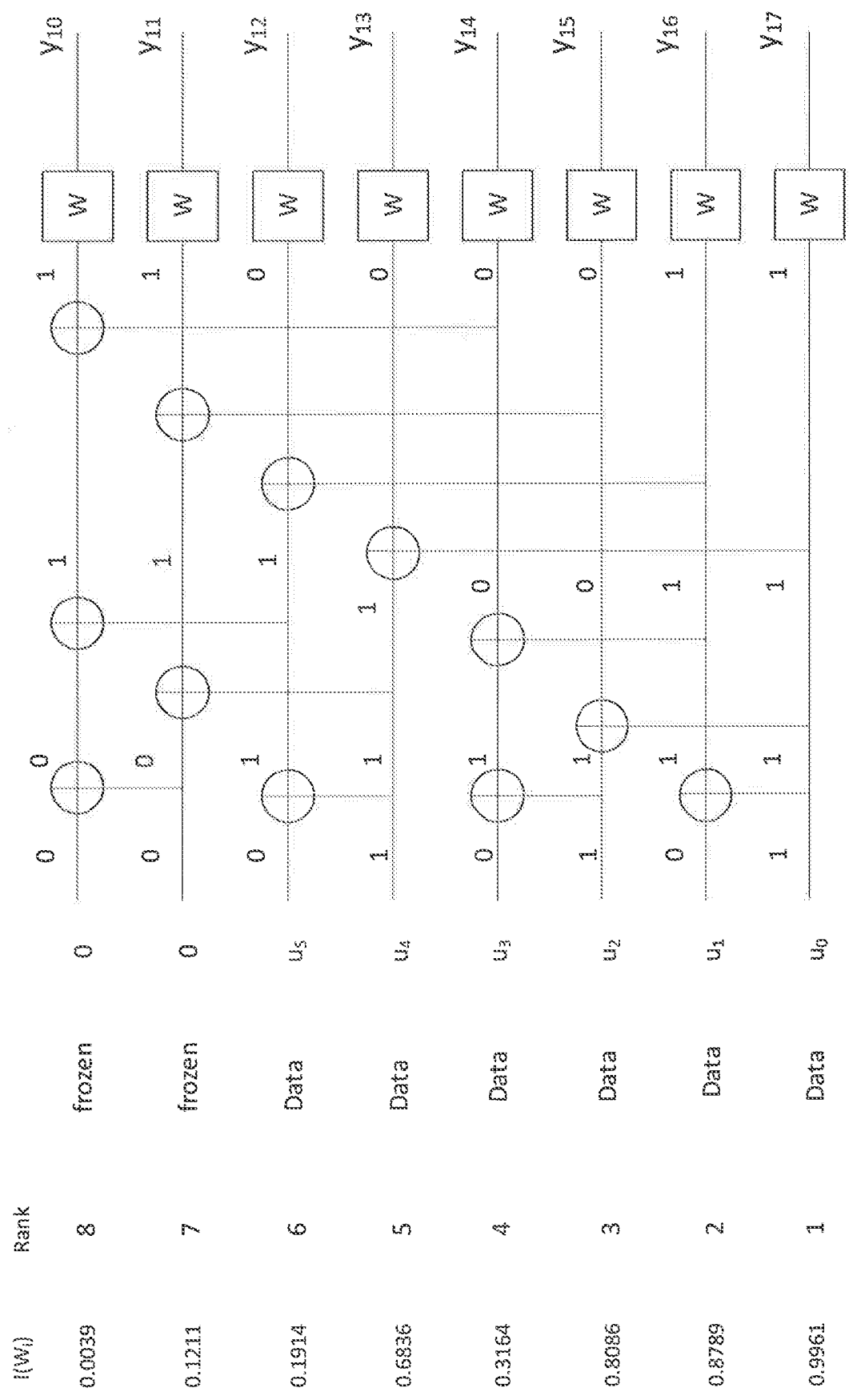
FIG. 1 illustrates an example of a polar code structure with N=8.
Figure 2:
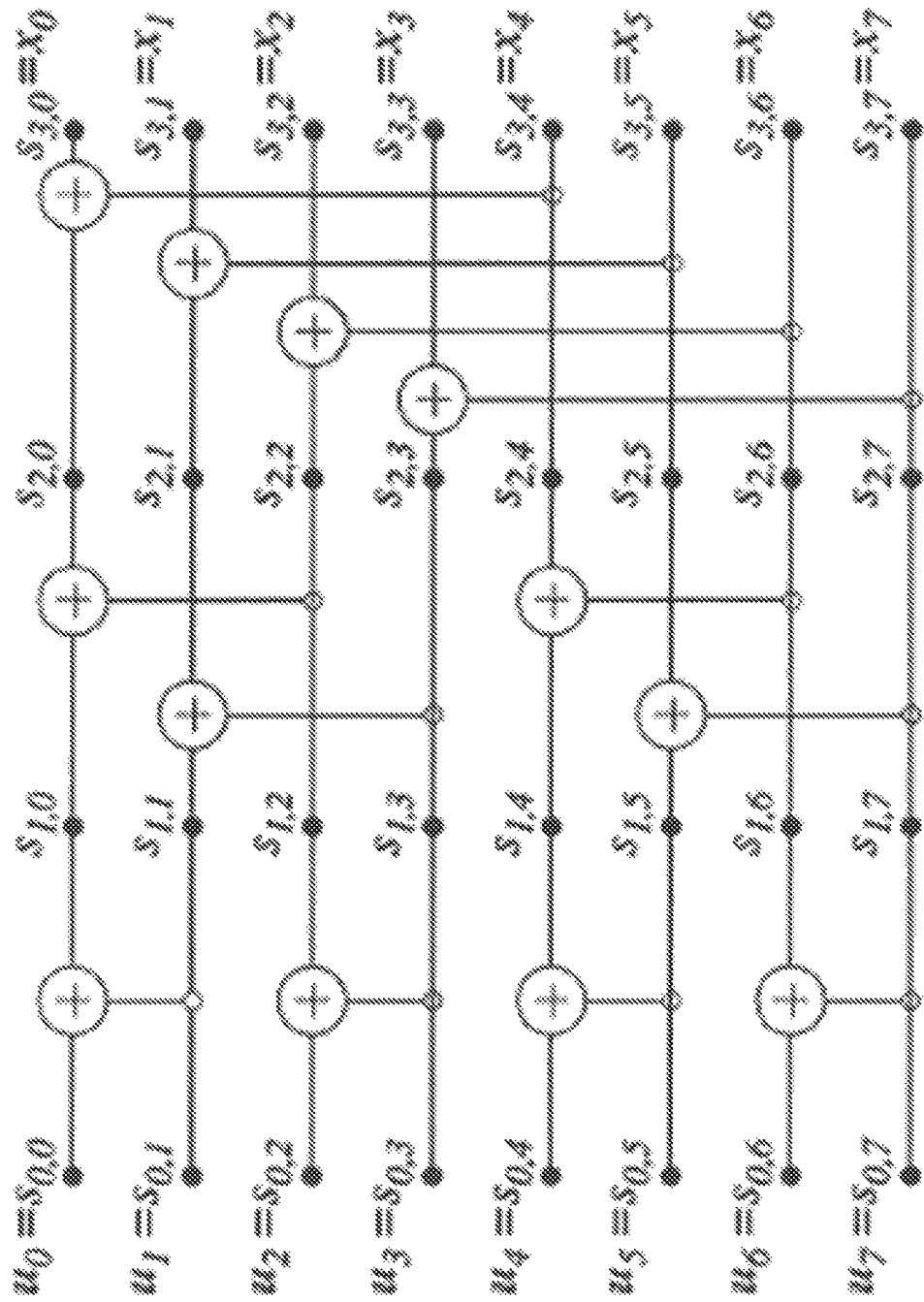
FIG. 2 illustrates labelling of intermediate bits in a polar code encoder with N=8.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) 5G NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Systems and methods are disclosed herein relating to polar codes and the use thereof in a wireless communications system.

In this disclosure, information sequences that are numerically optimized for some specific code length N are presented. The optimization is done in such a way that accounts for the performance of SCL decoders of different list sizes at different operating levels of BLER (e.g., BLER=1% or 0.1%).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

Listed below are length-128, length-256, length-512 and length-1024 sequences that perform well with a SCL decoder and a SC decoder in practice. Note that it should be clear to those skilled in the art that a subsequence (or part) of each of these sequences may be extracted and used in a SCL decoder to perform polar decoding while discarding the rest of the sequence.

Code sequence for length N=128. Listed below are length-128 sequences that perform well with an SCL decoder and an SC decoder in practice. The sequences are based on sequences of different beta values.

$S_{128}^1$ = [127 126 125 123 119 111 95 124 63 122 121 118 117 110 115 109 94 107 93 62 103 61 120 91 87 116 114 79 59 108 113 55 106 92 47 102 105 90 31 101 89 86 60 99 85 58 78 57 83 112 54 77 46 53 104 75 51 100 71 45 30 88 43 98 29 84 39 97 27 82 56 76 23 52 15 81 74 50 44 73 70 42 49 69 28 41 67 26 38 96 37 25 22 35 80 21 14 72 19 13 48 68 11 40 7 66 36 24 65 34 20 33 18 12 17 10 6 9 5 64 3 32 16 8 4 2 1 0];

$S_{128}^1$ =
[0    1    2    4    8    16   32   3    64   5    6
 9    10   17   12   18   33   20   34   65   24   36
 66   7    11   40   68   13   19   48   72   14   21
 80   35   22   25   37   96   38   26   67   41   28
 69   42   49   70   73   44   50   74   81   15   52
 23   76   56   82   27   97   39   84   29   98   43
 88   30   45   71   100  51   75   104  46   53   77
 54   83   57   112  78   58   85   99   60   86   89
 101  31   90   105  102  47   92   106  55   113  79
 108  59   114  116  87   91   120  61   103  62   93
 107  94   109  115  110  117  118  121  122  63   124
 95   111  119  123  125  126  127];

For example, if there are K=10 information bits, the information set A of size K=10 can be extracted from the sequence $S_{128}^1$ above by taking the first K=10 indices of the sequence, i.e.

A={127 126 125 123 119 111 95 124 63 122}.

Code Sequence for Length N=256: Listed below are length-256 sequences that perform well with an SCL decoder and an SC decoder in practice.

a) $S_{256}^1$ = [255 254 253 251 247 239 252 223 250 249 246 191 245 238 243 237 127 222 235 221 248 231 219 190 244 189 215 242 236 187 241 126 207 234 183 125 220 233 230 123 218 175 119 229 217 188 159 214 227 186 213 240 111 206 185 211 182 124 205 232 181 95 122 203 174 228 179 121 216 173 118 199 226 63 158 117 171 110 157 212 115 225 167 109 184 155 210 94 204 107 209 180 151 93 202 103 178 120 91 62 201 172 143 198 177 61 116 170 87 197 156 59 114 169 224 195 166 108 79 154 113 55 165 106 153 208 150 92 163 105 47 102 149 90 200 142 101

176 147 89 60 31 86 141 196 99 58 168 85 139 194 78 57 112 83
54 193 164 135 77 152 53 162 104 75 46 148 51 161 45 100 71 146
88 30 140 43 98 145 29 84 138 97 39 56 27 82 137 192 134 76 81
52 23 133 74 15 50 44 73 131 70 49 160 42 69 28 41 38 144 67
26 96 37 25 136 22 35 80 21 132 14 19 72 130 13 48 129 68 11
40 66 7 36 65 24 34 20 33 18 12 17 128 10 9 6 64 5 3 32
16 8 4 2 1 0];

b) $S_{256}^2$ = [255 254 253 251 247 239 252 223 250 249 246 191 245 238 243
237 127 222 235 221 248 231 219 190 244 189 215 242 236 187 241 126
207 234 183 125 220 233 230 123 218 175 119 229 217 188 159 214 227
186 213 240 111 206 185 211 182 124 205 232 181 95 122 203 174 228
179 121 216 173 118 199 226 63 158 117 171 110 157 212 115 225 167
109 184 155 210 94 204 107 209 180 151 93 202 120 178 103 91 62 201
172 143 198 177 116 61 170 87 197 156 114 108 169 224 195 166 59
113 154 79 55 165 106 153 208 150 92 163 105 47 102 149 90 200 142
31 176 147 101 89 99 60 141 196 86 85 168 58 139 194 112 78 57
83 54 193 164 135 77 152 104 162 53 75 46 148 100 161 51 88 45
146 71 98 140 30 43 145 84 97 138 29 56 82 39 76 137 192 134 27
81 52 74 133 23 50 73 44 15 131 70 49 160 42 69 28 41 96 144
67 38 26 37 25 136 80 22 35 21 132 14 19 72 130 13 48 129 68
11 40 66 7 36 65 24 34 20 33 18 12 17 128 10 9 6 64 5 3
32 16 8 4 2 1 0];

c) $S_{256}^3$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 108 169 224 195 166
59 113 154 79 55 165 106 153 208 150 92 163 105 47 102 149 90 200 142 31 176
147 101 89 99 60 141 196 86 85 168 58 139 194 112 78 57 83 54 193 164 135 77 152
104 162 53 75 46 148 100 161 51 88 45 146 71 98 140 30 43 145 84 97 138 29 56 82
39 76 137 192 134 27 81 52 74 133 23 50 73 44 15 131 70 49 160 42 69 28 41 96 144
67 38 26 37 25 136 80 22 35 21 132 14 19 72 130 13 48 129 68 11 40 66 7 36 65 24 34
20 33 18 12 17 128 10 9 6 64 5 3 32 16 8 4 2 1 0];

d) $S_{256}^4$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 59 169 224 195 166
108 79 154 113 55 165 106 153 208 150 92 163 47 105 102 149 90 200 142 101 176
147 89 99 60 31 141 196 86 58 168 85 139 194 78 112 57 83 54 193 164 135 77 152
104 162 53 75 46 148 100 161 51 88 45 146 71 98 140 30 43 145 84 29 138 97 56 82
39 27 137 192 134 76 81 52 74 133 23 50 73 44 70 131 15 49 160 42 69 28 96 41 144
67 38 26 80 37 136 25 22 35 72 132 21 14 48 130 68 19 129 13 66 11 40 7 36 24 65 34
20 33 18 12 17 128 10 9 64 6 5 3 32 16 8 4 2 1 0];

e) $S_{256}^5$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 108 169 224 195 166
59 113 154 79 55 165 106 153 208 150 92 163 105 47 102 149 90 200 142 31 176
147 101 89 99 60 141 196 86 85 168 58 139 194 112 78 57 83 54 193 164 135 77 152
104 162 53 75 46 148 100 161 51 88 45 146 71 98 140 30 43 145 84 97 138 29 39
137 82 56 134 76 27 81 133 52 74 23 192 50 73 44 15 131 70 49 160 42 69 28 41 96
144 67 38 26 37 25 136 80 22 35 21 132 14 19 72 130 13 48 129 68 11 40 66 7 36 65
24 34 20 33 18 12 17 128 10 9 6 64 5 3 32 16 8 4 2 1 0];

f) $S_{256}^6$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 59 169 224 195 166
108 79 154 113 55 165 106 153 208 150 92 163 47 105 102 149 90 200 142 101 176
147 89 99 60 31 141 196 86 58 168 85 139 194 78 112 57 83 54 193 164 135 77 152
104 162 53 75 46 148 100 161 51 88 45 146 71 98 140 30 43 145 84 29 138 97 56 137 82
39 134 27 76 81 133 52 74 23 192 50 73 44 70 131 15 49 160 42 69 28 96 41 144 67 38
26 80 37 136 25 22 35 72 132 21 14 48 130 68 19 129 13 66 11 40 7 36 24 65 34 20 33
18 12 17 128 10 9 64 6 5 3 32 16 8 4 2 1 0];

g) $S_{256}^7$ = [255 254 253 251 247 239 252 223 250 249 246 191 245 238 243 237 127 222
235 221 248 231 219 190 244 189 215 242 126 187 236 241 207 175 234 125 220
183 123 229 233 230 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 108 169 224 195 166
59 113 154 79 55 165 106 153 208 150 92 163 105 47 102 149 90 200 142 31 176
147 101 89 99 60 141 196 86 85 168 58 139 194 112 78 57 83 54 193 164 135 77 152
104 162 53 75 46 148 100 161 51 88 45 146 71 98 140 30 43 145 84 97 138 29 56 82

-continued 39 76 137 192 134 27 81 52 74 133 23 50 73 44 15 131 70 49 160 42 69 28 41 96 144
67 38 26 37 25 136 80 22 35 21 132 14 19 72 130 13 48 129 68 11 40 66 7 36 65 24
34 20 33 18 12 17 128 10 9 6 64 5 3 32 16 8 4 2 1 0];

h) $S_{256}^{8}$ = [255 254 253 251 247 239 252 223 250 249 246 191 245 238 243 237 127 222
235 221 248 231 219 190 244 189 215 242 126 187 236 241 207 175 234 125 220
183 123 229 233 230 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 59 169 224 195 166
108 79 154 113 55 165 106 153 208 150 92 163 47 105 102 149 90 200 142 101 176
147 89 99 60 31 141 196 86 58 168 85 139 194 78 112 57 83 54 193 164 135 77 152
104 162 53 75 46 148 100 161 51 88 45 146 71 98 140 30 43 145 84 29 138 97 56 82
39 27 137 192 134 76 81 52 74 133 23 50 73 44 70 131 15 49 160 42 69 28 96 41 144
67 38 26 80 37 136 25 22 35 72 132 21 14 48 130 68 19 129 13 66 11 40 7 36 24 65
34 20 33 18 12 17 128 10 9 64 6 5 3 32 16 8 4 2 1 0 ];

i) $S_{256}^{1}$ = [255 254 253 251 247 239 252 223 250 249 246 191 245 238 243 237 127 222
235 221 248 190 231 219 244 189 215 242 126 187 236 207 241 125 234 183 220
123 233 175 230 218 119 229 159 214 217 111 188 227 186 213 95 206 240 185 211
182 124 205 203 232 181 63 174 122 228 179 199 121 173 216 158 118 226 117 171
212 110 157 225 115 167 184 204 109 155 210 94 180 107 151 209 202 93 143 178
62 172 103 201 61 198 120 177 91 170 197 87 116 156 195 114 169 59 108 166 224
79 154 113 165 55 153 106 208 150 92 163 47 102 149 200 105 90 142 31 101 176
147 89 141 196 86 60 99 139 168 85 58 194 78 135 112 164 57 83 54 77 152 193 46
53 162 104 75 148 51 100 71 45 161 30 146 140 88 43 98 29 145 138 84 39 97 27
137 82 56 76 23 134 192 133 52 15 81 74 50 44 131 73 70 160 42 49 69 28 144 41 67
26 38 96 136 37 25 22 132 35 80 21 14 72 130 19 13 48 68 11 129 40 7 66 36 24 65
34 20 33 18 12 17 10 128 6 9 5 64 3 32 16 8 4 2 1 0 ];

j) $S_{256}^{1}$ = [0 1 2 4 8 16 32 3 64 5 6
9 128 10 17 12 18 33 20 34 65 24
36 66 7 11 129 40 68 13 19 48 130
72 14 21 80 35 132 22 25 37 136 96
38 26 67 41 144 28 69 42 49 160 70
73 131 44 50 74 81 15 52 133 192 134
23 76 56 82 137 27 97 39 84 138 145
29 98 43 88 140 146 30 161 45 71 100
51 148 75 104 162 46 53 193 152 77 54
83 57 164 112 135 78 194 58 85 168 139
99 60 86 196 141 89 147 176 101 31 142
90 105 200 149 102 47 208 92 150 163 106
153 55 165 113 154 79 224 166 108 59 169
114 195 156 116 87 197 170 91 177 120 198
61 201 103 172 62 178 143 93 202 209 151
107 180 94 210 155 109 204 184 167 115 225
157 110 212 171 117 226 118 158 216 173 121
199 179 228 122 174 63 181 232 203 205 124
182 211 185 240 206 95 213 186 227 188 111
217 214 159 229 119 218 230 175 233 123 220
183 234 125 241 207 236 187 126 242 215 189
244 248 219 190 231 221 235 222 237 243 245
127 238 246 249 250 191 252 223 239 247 251
253 254 255];

For example, if there are K=10 information bits, the information set A of size K=10 can be extracted from the sequence $S_{256}^{1}$ above by taking the first K=10 indices of the sequence, i.e.

A={255 254 253 251 247 239 252 223 250 249}.

Similarly, for another example, if there are K=16 information bits, the information set A of size K=16 can be extracted from the sequence $S_{256}^{2}$ above by taking the first K=16 indices of the sequence, i.e.

A={255 254 253 251 247 239 252 223 250 249 246 191 245 238 243 237}.

These indices in A specifies the information bit locations where the data bits should be loaded for the Polar encoder, and they are also the location where the decoder should extract the data during an SC or SCL decoding process.

Code Sequence for Length N=512: Listed below is a length-512 sequence that performs well with an SCL decoder and an SC decoder in practice. The sequence is based on sequences of different beta values. The sequence is written in the format of lowest reliability to highest reliability.

$S_{512}^{1}$ = [0 1 2 4 8 16 32 3 64 5 6
9 128 256 10 17 12 18 33 20 34 65
24 36 66 7 11 129 40 68 257 13 19
48 130 72 14 258 21 80 260 35 132 22
25 264 37 136 96 272 38 26 67 41 144
28 288 69 42 49 160 70 73 131 44 50
320 74 81 15 52 384 133 192 134 23 76
56 82 137 27 259 97 261 39 84 138 145
29 98 262 265 43 88 140 146 30 161 45
71 100 266 273 51 148 268 75 104 162 46
274 53 193 152 289 276 77 54 83 57 164
112 135 78 194 290 280 58 321 85 168 292
139 322 99 60 86 196 296 141 89 263 385
324 147 176 101 31 142 304 90 328 105 386
200 149 102 47 208 92 267 150 163 388 106
153 336 55 269 165 113 154 79 224 275 392
270 352 166 400 108 59 169 114 195 156 116
277 278 87 197 170 291 416 281 293 91 177
120 198 61 282 201 448 294 103 172 62 178
143 284 323 93 202 297 209 151 298 107 180
94 325 210 305 300 326 155 109 204 184 387
306 271 329 167 115 225 330 157 110 212 308
389 337 332 312 171 117 226 279 118 158 216
390 338 393 173 121 353 340 199 394 283 179

-continued 228 122 174 63 181 232 295 203 205 285 124
182 354 211 401 299 185 240 206 95 344 356
402 286 417 327 301 396 307 213 186 418 360
227 309 331 188 111 449 302 217 214 159 404
333 408 310 368 229 119 339 218 313 230 420
175 334 391 450 341 233 123 220 183 314 395
424 355 234 125 241 345 342 452 397 287 207
432 316 357 403 236 187 346 398 361 126 242
456 405 215 189 244 358 303 362 464 419 406
348 248 219 409 311 421 369 190 231 480 335
410 425 370 315 221 422 364 235 317 451 343
412 222 433 453 372 237 426 243 454 347 376
428 457 318 359 245 127 238 465 434 399 458
363 349 407 436 246 350 249 460 411 365 440

-continued 371 481 250 423 466 413 366 468 191 482 427
373 252 414 374 472 377 455 429 223 484 435
430 319 378 459 239 437 488 461 380 247 467
438 441 462 351 469 367 442 251 470 415 496
483 444 473 375 253 254 485 431 474 379 486
489 476 381 439 490 463 382 497 443 492 498
471 445 255 500 446 475 487 504 477 491 478
383 493 499 494 501 447 502 505 506 479 508
495 503 507 509 510 511];

Code Sequence for Length N=1024: Listed below are length-1024 sequences that perform well with an SCL decoder and an SC decoder in practice.

a) $S_{1024}^1$ = [1023 1022 1021 1019 1015 1007 1020 991 1018 1017
1014 959 1013 1006 1011 1005 895 990 1003 989
1016 999 987 958 1012 767 957 983 1010 1004 955
1009 894 975 1002 951 893 988 1001 998 511 891
986 943 997 985 766 956 887 982 995 765 927
954 981 1008 879 974 763 953 979 950 892 973
1000 759 949 863 510 890 971 942 996 947 509
889 984 751 941 886 967 994 507 764 831 926
885 939 980 993 878 735 925 762 952 503 883
978 935 877 972 761 923 977 758 948 862 495
875 970 703 757 919 946 861 508 888 969 750
940 871 966 755 945 479 859 506 749 830 911
639 884 505 938 965 734 829 502 747 855 992
924 937 882 963 934 876 733 447 760 827 922
501 743 494 881 847 731 933 702 499 976 874
921 823 756 918 931 860 493 873 968 701 870
727 917 754 944 383 478 858 491 815 748 699
477 910 869 753 964 638 915 504 719 857 828
909 746 854 936 487 867 962 695 475 637 732
799 446 745 826 853 907 500 880 961 742 932
846 255 445 635 730 825 920 471 687 851 498
741 822 903 930 845 492 872 729 443 700 497
631 726 821 916 739 929 382 463 843 490 814
671 868 698 725 439 752 819 914 381 476 856
489 623 718 813 908 839 697 486 866 723 913
694 379 474 636 717 798 431 485 254 811 607
744 375 693 852 473 906 444 865 634 797 470
715 253 686 483 960 415 824 807 905 691 850
740 633 442 469 902 795 367 685 844 630 251
728 711 496 575 462 849 820 441 738 901 670
467 629 438 683 842 380 791 928 461 247 724
622 737 818 351 669 488 899 437 841 627 812
378 696 679 838 459 621 722 430 817 783 667
239 716 435 912 484 377 810 837 606 721 429
374 692 619 472 455 864 319 796 714 252 809
663 482 605 414 835 373 806 427 904 690 223
632 615 468 713 794 366 684 481 250 413 710
603 805 574 371 689 848 655 440 423 900 793
365 466 628 249 682 709 790 411 573 460 246
803 599 736 191 350 668 465 898 436 363 681
840 626 789 707 245 678 571 458 620 407 816
349 782 897 666 238 625 434 591 376 787 359
677 836 457 243 720 428 618 781 567 454 347
665 237 318 433 399 808 662 127 604 675 834
372 617 426 453 222 779 317 614 235 712 343
661 480 559 412 833 602 804 425 370 688 221
654 451 613 422 315 792 364 775 248 659 231
708 601 410 572 369 802 335 653 598 219 421
190 611 464 543 362 680 311 788 409 706 244
801 570 597 406 651 189 348 419 896 361 215
624 590 705 786 358 676 569 456 242 405 595
303 780 566 187 346 664 236 647 432 589 398
785 357 126 241 674 207 616 403 565 452 345
778 316 234 397 183 342 660 587 125 558 355
673 832 287 424 220 777 563 450 612 233 314
341 774 395 557 658 230 123 600 583 368 175
334 652 449 218 420 313 542 339 229 610 310
773 555 119 657 391 408 333 217 188 159 214
541 596 309 227 650 418 609 360 800 111 331
551 302 771 186 568 213 404 539 594 649 307
704 417 206 646 588 301 356 185 240 327 211
182 124 402 593 344 564 784 95 205 535 286

-continued 645 396 586 299 354 181 401 122 232 562 672
285 340 203 174 643 394 585 556 353 776 527
582 295 179 121 561 312 63 118 173 283 228
338 393 448 554 199 390 581 332 216 158 117
171 279 110 308 337 540 226 656 772 157 553
389 115 330 550 579 212 608 109 167 225 306
538 770 155 271 184 300 329 387 549 416 94
648 210 326 107 305 537 204 769 534 592 298
93 151 547 180 209 325 644 284 103 202 533
400 297 62 91 120 178 294 323 526 352 584
642 143 172 201 282 531 560 198 61 177 293
525 392 87 641 116 281 580 170 197 278 59
336 291 523 156 552 388 114 169 578 79 277
108 166 195 224 55 154 270 113 519 328 386
548 577 165 275 106 304 536 768 153 269 385
92 150 546 208 47 324 105 163 102 532 267
296 149 545 90 322 142 101 200 530 31 60
89 147 263 176 292 321 524 86 640 141 280
99 529 196 58 290 85 522 139 168 78 276
194 57 289 521 54 83 112 518 576 77 135
164 193 274 53 152 268 517 384 46 75 273
104 162 51 266 515 148 544 45 161 71 100
265 30 88 146 262 43 320 140 98 528 29
145 261 84 39 138 97 27 56 259 288 520
82 137 76 134 192 23 52 81 516 133 74
272 50 514 15 44 73 131 160 70 49 264
513 42 69 28 144 260 41 38 67 96 26
258 37 136 25 257 22 80 35 132 21 14
72 130 19 48 512 13 129 68 11 40 66
736 65 24 256 34 20 33 18 12 128 17
10 9 6 64 5 3 32 16 8 4 2
1 0];
b) $S_{1024}{}^2$ = [1023 1022 1021 1019 1015 1007 1020 991 1018 1017
1014 959 1013 1006 1011 1005 895 990 1003 989
1016 999 987 958 1012 767 957 983 1010 1004 955
1009 894 975 1002 951 893 988 1001 998 511 891
986 943 997 985 766 956 887 982 995 765 927
954 981 1008 879 974 763 953 979 950 892 973
1000 759 949 863 510 890 971 942 996 947 509
889 984 751 941 886 967 994 507 764 831 926
885 939 980 993 878 735 925 762 952 503 883
978 935 877 972 761 923 977 758 948 862 495
875 970 703 757 919 946 861 508 888 969 750
940 871 966 755 945 479 859 506 749 830 911
639 884 505 938 965 734 829 502 747 855 992
924 937 882 963 934 876 733 447 760 827 922
501 743 494 881 847 731 933 702 499 976 874
921 823 756 918 931 860 493 873 968 701 870
727 917 754 944 383 478 858 491 815 748 699
477 910 869 753 964 638 915 504 719 857 828
909 746 854 936 487 867 962 695 475 637 732
799 446 745 826 853 907 500 880 961 742 932
846 255 445 635 730 825 920 471 687 851 498
741 822 903 930 845 492 872 729 443 700 497
631 726 821 916 739 929 382 463 843 490 814
671 868 698 725 439 752 819 914 381 476 856
489 623 718 813 908 839 697 486 866 723 913
694 379 474 636 717 798 431 485 254 811 607
744 375 693 852 470 906 253 865 634 797 473
715 415 686 483 960 444 824 807 905 691 850
740 633 251 462 902 795 367 685 844 630 442
728 711 496 575 438 849 820 469 738 901 670
441 629 351 683 842 467 791 928 461 247 724
622 737 818 488 669 380 899 484 841 627 812
437 696 679 838 319 621 722 459 817 783 667
430 716 239 912 378 455 810 837 606 721 435
429 692 619 374 472 864 377 796 714 414 809
663 252 605 223 835 468 806 373 904 690 427
632 615 482 713 794 413 684 481 250 366 710
603 805 574 423 689 848 655 440 350 900 793
466 460 628 411 682 709 790 249 573 371 365
803 599 736 458 407 668 246 898 363 191 681
840 626 789 707 436 678 571 399 620 434 816
349 782 897 666 245 625 465 591 359 787 318
677 836 457 428 720 238 618 781 567 376 347
665 454 243 426 237 808 662 127 604 675 834
372 617 453 433 222 779 480 614 317 712 412
661 343 559 425 833 602 804 235 370 688 451
654 422 613 221 364 792 315 775 248 659 410

```
708 601 335 572 231 802 421 653 598 369 311
219 611 348 543 190 680 406 788 419 706 464
801 570 597 362 651 303 358 409 896 244 189
624 590 705 786 346 676 569 405 215 456 595
242 780 566 126 361 664 452 647 403 589 398
785 345 187 287 674 357 616 316 565 236 432
778 397 342 424 241 207 660 587 183 558 395
673 832 355 234 125 777 563 341 612 220 175
391 774 314 557 658 450 123 600 583 420 230
334 652 339 233 229 218 542 368 313 610 449
773 555 408 657 310 333 217 309 331 418 360
541 596 119 188 650 214 609 227 800 302 307
551 159 771 404 568 417 186 539 594 649 213
704 301 327 646 588 111 356 402 396 299 344
286 401 354 593 240 564 784 206 185 535 211
645 182 586 124 205 285 394 340 353 562 672
295 95 203 232 643 181 585 556 122 776 527
582 174 393 283 561 338 390 312 332 228 179
121 337 389 554 308 279 581 216 173 118 199
330 63 226 158 117 540 171 656 772 306 553
329 212 387 550 579 225 608 110 157 326 300
538 770 271 305 448 325 298 184 549 115 210
648 167 109 204 155 537 209 769 534 592 297
180 94 547 107 284 202 644 151 323 416 533
294 178 93 282 293 400 281 120 526 201 584
642 172 103 352 336 531 560 198 177 91 62
525 143 278 641 291 392 580 116 170 197 61
277 388 523 270 552 275 328 386 578 224 156
87 169 114 269 195 166 108 59 519 154 113
548 577 79 55 304 267 536 768 324 385 208
165 106 546 153 150 163 92 105 296 532 322
263 200 545 149 292 321 280 176 530 47 102
90 142 290 196 147 60 524 101 640 89 141
276 529 168 99 289 194 522 31 86 85 58
139 274 268 521 112 193 164 518 576 78 57
152 83 54 135 273 162 517 77 266 104 53
148 161 75 46 515 265 544 100 51 146 262
88 45 140 71 98 145 43 30 261 528 84
138 384 97 29 39 259 320 288 192 137 520
82 56 134 76 27 81 52 133 516 272 160
74 23 514 50 131 73 44 49 70 15 264
513 144 42 69 28 41 260 96 136 67 38
26 37 258 132 25 80 22 35 257 130 21
14 48 129 72 512 19 13 68 11 40 66
36 7 65 24 34 20 33 256 128 18 12
17 10 9 6 64 5 3 32 16 8 4
2 1 0];
``` c) $S_{1024}^3$ = [1023 1022 1021 1019 1015 1007 1020 991 1018 1017
1014 959 1013 1006 1011 1005 895 990 1003 989
1016 999 987 958 1012 767 957 983 1010 1004 955
1009 894 975 1002 951 893 988 1001 998 511 891
986 943 997 985 766 956 887 982 995 765 927
954 981 1008 879 974 763 953 979 950 892 973
1000 759 949 863 510 890 971 942 996 947 509
889 984 751 941 886 967 994 507 764 831 926
885 939 980 993 878 735 925 762 952 503 883
978 935 877 972 761 923 977 758 948 862 495
875 970 703 757 919 946 861 508 888 969 750
940 871 966 755 945 479 859 506 749 830 911
639 884 505 938 965 734 829 502 747 855 992
924 937 882 963 934 876 733 447 760 827 922
501 743 494 881 847 731 933 702 499 976 874
921 823 756 918 931 860 493 873 968 701 870
727 917 754 944 383 478 858 491 815 748 699
477 910 869 753 964 638 915 504 719 857 828
909 746 854 936 487 867 962 695 475 637 732
799 446 745 826 853 907 500 880 961 742 932
846 255 445 635 730 825 920 471 687 851 498
741 822 903 930 845 492 872 729 443 700 497
631 726 821 916 739 929 382 463 843 490 814
671 868 698 725 439 752 819 914 381 476 856
489 623 718 813 908 839 697 486 866 723 913
694 379 474 636 717 798 431 485 254 811 607
744 375 693 852 470 906 253 865 634 797 473
715 415 686 483 960 444 824 807 905 691 850
740 633 251 462 902 795 367 685 844 630 442
728 711 496 575 438 849 820 469 738 901 670
441 629 351 683 842 467 791 928 461 247 724
622 737 818 488 669 380 899 484 841 627 812

```
437 696 679 838 319 621 722 459 817 783 667
430 716 239 912 378 455 810 837 606 721 435
429 692 619 374 472 864 377 796 714 414 809
663 252 605 223 835 468 806 373 904 690 427
632 615 482 713 794 413 684 481 250 366 710
603 805 574 423 689 848 655 440 350 900 793
466 460 628 411 682 709 790 249 573 371 365
803 599 736 458 407 668 246 898 363 191 681
840 626 789 707 436 678 571 399 620 434 816
349 782 897 666 245 625 465 591 359 787 318
677 836 457 428 720 238 618 781 567 376 347
665 454 243 426 237 808 662 127 604 675 834
372 617 453 433 222 779 480 614 317 712 412
661 343 559 425 833 602 804 235 370 688 451
654 422 613 221 364 792 315 775 248 659 410
708 601 335 572 231 802 421 653 598 369 311
219 611 348 543 190 680 406 788 419 706 464
801 570 597 362 651 303 358 409 896 244 189
624 590 705 786 346 676 569 405 215 456 595
242 780 566 126 361 664 452 647 403 589 398
785 345 187 287 674 357 616 316 565 236 432
778 397 342 424 241 207 660 587 183 558 395
673 832 355 234 125 777 563 341 612 220 175
391 774 314 557 658 450 123 600 583 420 230
334 652 339 233 229 218 542 368 313 610 449
773 555 408 657 310 333 119 309 331 418 360
541 596 217 188 650 214 609 227 800 302 307
551 159 771 404 568 417 186 539 594 649 213
704 301 327 646 588 111 356 402 396 299 344
286 401 354 593 240 564 784 206 185 535 211
645 182 586 124 205 285 394 340 353 562 672
295 95 203 232 643 181 585 556 122 776 527
582 174 393 283 561 338 390 312 332 228 179
121 337 389 554 308 279 581 216 173 118 199
330 63 226 158 117 540 171 656 772 306 553
329 110 387 550 579 157 608 212 115 326 300
538 770 271 305 448 325 298 225 549 167 109
648 184 155 210 94 537 204 769 534 592 297
107 209 547 180 284 151 644 93 323 416 533
294 202 120 282 293 400 281 178 526 103 584
642 91 62 352 336 531 560 201 172 143 198
525 177 278 641 291 392 580 116 61 170 87
277 388 523 270 552 275 328 386 578 197 156
114 108 169 269 224 195 166 59 519 113 154
548 577 79 55 304 267 536 768 324 385 165
106 153 546 208 150 92 163 105 296 532 322
263 47 545 102 292 321 280 149 530 90 200
142 31 290 176 147 101 524 89 640 99 60
276 529 141 196 289 86 522 85 168 58 139
194 274 268 521 112 78 57 518 576 83 54
193 164 135 77 273 152 517 104 266 162 53
75 46 148 100 515 265 544 161 51 88 262
45 146 71 98 140 30 43 145 261 528 84
97 384 138 29 56 259 320 288 82 39 520
76 137 192 134 27 81 52 74 516 272 133
23 50 514 73 44 15 131 70 49 160 264
513 42 69 28 41 96 260 144 67 38 26
37 25 258 136 80 22 35 21 257 132 14
19 72 130 13 512 48 129 68 11 40 66
736 65 24 34 20 33 256 18 12 17 128
10 9 6 64 5 3 32 16 8 4 2
1 0];
``` d) $S_{1024}^4 = $ [1023 1022 1021 1019 1015 1007 1020 991 1018 1017
1014 959 1013 1006 1011 1005 895 990 1003 989
1016 999 987 958 767 1012 957 983 1010 955
1004 894 1009 975 1002 951 893 511 988 1001 998
891 943 986 997 766 887 985 956 982 765 995
927 954 981 879 763 1008 974 953 979 950 892
973 759 510 863 1000 949 890 971 509 942 751
947 996 889 941 886 507 984 967 831 764 994
926 885 939 735 503 980 878 993 762 925 883
952 935 877 978 761 923 495 972 758 703 862
977 948 875 757 970 508 919 861 750 946 479
888 871 969 755 940 506 966 859 749 830 945
911 639 884 505 938 965 734 829 502 747 855
992 447 924 937 882 733 963 501 934 827 876
760 743 922 494 881 847 731 933 702 499 976
874 921 823 756 918 931 860 493 873 968 701
870 727 917 754 944 383 478 858 491 815 748

```
699 477 910 869 753 964 638 915 504 719 857
828 909 746 854 936 487 867 962 695 475 637
732 799 446 745 826 853 907 500 880 961 742
932 846 255 445 635 730 825 920 471 687 851
498 741 822 903 930 845 492 872 729 443 700
497 631 726 821 916 739 929 382 463 843 490
814 671 868 698 725 439 752 819 914 381 476
856 489 623 718 813 908 839 697 486 866 723
913 694 379 474 636 717 798 431 485 254 811
607 744 375 693 852 473 906 444 865 634 797
470 715 253 686 483 960 415 824 807 905 691
850 740 633 442 469 902 795 367 685 844 630
251 728 711 496 575 462 849 820 441 738 901
670 467 629 438 683 842 380 791 928 461 247
724 622 737 818 351 669 488 899 437 841 627
812 378 696 679 838 459 621 722 430 817 783
667 239 716 435 912 484 377 810 837 606 721
429 374 692 619 472 455 864 319 796 714 252
809 663 482 605 414 835 373 806 427 904 690
223 632 615 468 713 794 366 684 481 250 413
710 603 805 574 371 689 848 655 440 423 900
793 365 466 628 249 682 709 790 411 573 460
246 803 599 736 191 350 668 465 898 436 363
681 840 626 789 707 245 678 571 458 620 407
816 349 782 897 666 238 625 434 591 376 787
359 677 836 457 243 720 428 618 781 567 454
347 665 237 318 433 399 808 662 127 604 675
834 372 617 426 453 222 779 317 614 235 712
343 661 480 559 412 221 602 425 370 833 315
804 654 451 688 613 422 364 231 248 335 219
775 190 659 410 601 572 369 792 543 598 653
311 708 421 611 362 802 189 244 409 464 570
215 680 406 597 348 788 651 706 419 361 801
590 303 358 187 242 569 624 405 126 595 236
346 566 705 456 676 786 896 207 647 398 589
357 780 241 664 432 183 125 403 345 565 316
785 234 674 616 287 342 397 452 587 558 355
778 220 660 123 233 563 314 673 424 341 175
230 395 450 557 612 777 832 583 334 218 774
658 600 313 368 119 542 229 339 652 310 449
420 555 610 391 333 217 773 188 657 408 159
214 541 596 309 227 650 418 609 360 800 111
331 551 302 771 186 568 213 404 539 594 649
307 704 417 206 646 588 301 356 185 240 327
211 182 124 402 593 344 564 784 95 205 535
286 645 396 586 299 354 181 401 122 232 562
672 285 340 203 174 643 394 585 556 353 776
527 582 295 179 121 561 312 63 118 173 283
228 338 199 393 158 117 554 216 332 390 581
171 448 279 110 308 337 540 226 656 772 157
553 389 115 330 550 579 212 608 109 167 225
306 538 770 155 271 184 300 329 387 549 416
94 648 210 326 107 305 537 204 769 534 592
298 93 151 547 180 209 325 644 284 103 202
533 400 297 62 91 120 178 294 323 526 352
584 642 143 172 201 282 531 560 198 61 177
293 525 392 87 641 116 281 580 170 197 278
59 336 291 523 156 114 79 169 55 108 166
277 552 195 388 154 578 113 270 224 519 165
106 275 328 386 548 47 153 577 269 92 304
150 536 105 163 385 102 208 324 546 768 267
149 90 532 31 296 142 101 545 322 60 89
147 200 263 86 141 530 176 99 292 321 524
58 280 85 196 529 640 139 78 290 522 57
168 54 83 276 194 77 289 135 112 521 518
53 164 193 274 46 152 576 75 268 517 51
104 162 273 384 45 266 148 71 515 161 30
100 544 43 265 88 146 262 29 140 98 320
39 145 261 84 528 27 138 97 56 259 82
137 23 76 288 134 520 52 81 192 133 74
516 15 50 272 44 73 131 70 514 49 160
42 264 69 513 28 41 38 144 67 260 26
96 37 258 25 136 22 35 257 80 21 132
14 19 72 130 13 48 129 68 512 11 40
66 736 65 24 34 256 20 33 18 12 17
128 10 9 6 64 5 3 32 16 8 4
2 1 0];
```

-continued e) $S_{1024}^5$ = [1023 1022 1021 1019 1015 1007 1020 991 1018 1017 1014 959 1013 1006
1011 1005 895 990 1003 989 1016 999 987 958 767 1012 957 983 1010 955 1004 894
1009 975 1002 951 893 511 988 1001 998 891 943 986 997 766 887 985 956 982
765 995 927 954 981 879 763 1008 974 953 979 950 892 973 759 510 863 1000 949
890 971 509 942 751 947 996 889 941 886 507 984 967 831 764 994 926 885 939
735 503 980 878 993 762 925 883 952 935 877 978 761 923 495 972 758 703 862
977 948 875 757 970 508 919 861 750 946 479 888 871 969 755 940 506 966 859
749 830 945 911 639 884 505 938 965 734 829 502 747 855 992 447 924 937 882
733 963 501 934 827 876 760 743 922 494 881 847 731 933 702 499 976 874 921
823 756 918 931 860 493 873 968 701 870 727 917 754 944 383 478 858 491 815
748 699 477 910 869 753 964 638 915 504 719 857 828 909 746 854 936 487 867
962 695 475 637 732 799 446 745 826 853 907 500 880 961 742 932 846 255 445
635 730 825 920 471 687 851 498 741 822 903 930 845 492 872 729 443 700 497
631 726 821 916 739 929 382 463 843 490 814 671 868 698 725 439 752 819 914
381 476 856 489 623 718 813 908 839 697 486 866 723 913 694 379 474 636 717
798 431 485 254 811 607 744 375 693 852 470 906 253 865 634 797 473 715 415
686 483 960 444 824 807 905 691 850 740 633 251 462 902 795 367 685 844 630
442 728 711 496 575 438 849 820 469 738 901 670 441 629 351 683 842 467 791
928 461 247 724 622 737 818 488 669 380 899 484 841 627 812 437 696 679 838
319 621 722 459 817 783 667 430 716 239 912 378 455 810 837 606 721 435 429
692 619 374 472 864 377 796 714 414 809 663 252 605 223 835 468 806 373 904
690 427 632 615 482 713 794 413 684 481 250 366 710 603 805 574 423 689 848
655 440 350 900 793 466 460 628 411 682 709 790 249 573 371 365 803 599 736
458 407 668 246 898 363 191 681 840 626 789 707 436 678 571 399 620 434 816
349 782 897 666 245 625 465 591 359 787 318 677 836 457 428 720 238 618 781
567 376 347 665 454 243 426 237 808 662 127 604 675 834 372 617 453 433 222
779 480 614 317 712 412 661 343 559 425 235 602 370 451 833 422 804 654 221
688 613 364 315 248 410 335 231 775 421 659 369 601 572 311 792 543 598 653
219 708 348 611 190 802 406 419 464 362 570 303 680 358 597 409 788 651 706
244 189 801 590 346 405 215 456 569 624 242 126 595 361 452 566 705 403 676
786 896 398 647 345 589 187 780 287 664 357 316 236 432 397 565 342 785 424
674 616 241 207 183 395 587 558 355 778 234 660 125 341 563 220 673 175 391
314 450 123 420 557 612 777 832 583 230 334 774 658 600 339 233 229 542 218
368 652 313 449 408 555 610 310 333 119 773 309 657 331 418 360 541 596 217
188 650 214 609 227 800 302 307 551 159 771 404 568 417 186 539 594 649 213
704 301 327 646 588 111 356 402 396 299 344 286 401 354 593 240 564 784 206
185 535 211 645 182 586 124 205 285 394 340 353 562 672 295 95 203 232 643 181
585 556 122 776 527 582 174 393 283 561 338 390 312 332 228 179 121 337 389
308 279 554 216 173 118 581 199 330 63 226 158 117 540 171 656 772 306 553 329
110 387 550 579 157 608 212 115 326 300 538 770 271 305 448 325 298 225 549
167 109 648 184 155 210 94 537 204 769 534 592 297 107 209 547 180 284 151 644
93 323 416 533 294 202 120 282 293 400 281 178 526 103 584 642 91 62 352 336
531 560 201 172 143 198 525 177 278 641 291 392 580 116 61 170 87 277 388 523
270 275 328 386 197 156 114 108 552 169 269 224 578 195 166 59 519 113 154 79
55 304 548 267 324 577 385 165 106 153 536 208 150 92 163 105 296 546 768 322
263 47 532 102 292 321 280 545 149 90 200 142 31 290 176 147 530 101 89 99 60
524 276 141 196 289 529 640 86 85 168 522 58 139 194 274 268 112 78 57 83 54
521 518 193 164 135 77 273 152 576 104 266 517 162 53 75 46 148 100 265 161 51
515 88 262 45 544 146 71 98 140 30 43 145 261 84 97 384 138 29 528 56 259 320
288 82 39 76 137 192 134 27 520 81 52 74 272 133 516 23 50 73 44 15 131 70 514
49 160 264 42 69 513 28 41 96 260 144 67 38 26 37 25 258 136 80 22 35 21 257 132
14 19 72 130 13 48 129 68 512 11 40 66 7 36 65 24 34 20 33 256 18 12 17 128 10 9 6
64 5 3 32 16 8 4 2 1 0];
f) $S_{1024}^1$ = [0 1 2 4 8 16 32 3 64 5 6
9 128 256 10 17 12 512 18 33 20 34
65 24 36 66 7 11 129 40 68 257 13
19 48 130 72 14 258 21 80 260 35 132
22 25 264 513 37 136 96 272 38 26 67
514 41 144 28 288 69 516 42 49 160 70
73 131 44 50 320 520 74 81 15 52 384
133 192 528 134 23 76 56 82 137 27 259
544 97 261 39 84 138 145 29 98 262 265
43 88 576 140 146 30 161 45 71 515 100
266 273 51 640 148 268 75 104 162 46 517
274 53 193 152 289 768 276 77 54 83 518
57 521 164 112 135 78 194 290 280 522 58
321 85 168 292 139 322 99 529 60 86 524
196 296 141 89 263 385 530 324 147 176 101
31 142 304 90 545 532 328 105 386 200 149
102 47 208 546 92 267 150 536 163 388 106
153 336 55 548 269 577 165 113 154 79 519
224 275 392 270 352 166 578 400 552 108 59
169 114 195 156 116 277 278 641 523 580 87
560 197 170 291 416 281 293 91 177 120 198
584 642 61 282 525 201 448 294 103 172 531
62 526 769 644 592 178 143 284 323 93 202
297 209 151 298 107 533 180 770 648 608 94
325 210 305 547 534 300 326 155 109 204 537
772 184 387 306 271 329 656 167 115 225 330

549 157 110 538 212 308 389 337 672 776 332
550 312 171 117 579 226 540 279 118 553 158
216 390 338 393 173 121 353 784 704 581 554
340 199 394 283 179 228 122 174 527 561 582
63 556 181 232 295 203 205 285 124 643 182
800 585 562 354 211 401 299 185 240 206 586
95 564 535 344 645 356 402 286 832 417 327
593 588 301 396 307 568 646 213 186 418 360
594 227 309 539 331 188 771 896 649 111 449
302 217 214 159 404 551 609 596 333 408 650
541 310 368 229 773 119 339 218 313 230 420
657 610 542 652 600 175 334 391 450 341 555
233 123 774 658 220 612 183 314 777 395 424
355 234 125 583 241 557 345 342 452 673 660
616 563 778 397 287 207 558 432 316 357 674
403 236 187 664 785 587 624 346 780 398 565
361 126 242 456 405 676 705 215 786 189 244
566 358 589 647 303 362 464 569 419 706 680
595 406 348 590 801 788 248 219 409 570 311
421 543 708 369 802 651 688 597 190 792 231
480 572 335 410 425 370 315 611 598 804 833
712 221 422 653 364 601 235 317 775 451 343
659 412 222 433 453 613 559 654 834 808 602
720 372 237 426 614 243 454 604 897 661 836
816 347 779 617 376 428 457 736 318 359 245
675 567 662 127 238 840 465 618 898 434 399
665 781 458 591 625 363 620 349 677 407 436
787 666 246 782 571 900 848 350 249 626 460
411 678 365 707 668 789 440 681 573 371 628
599 481 250 904 864 423 803 574 466 790 413
366 468 191 709 682 482 632 427 793 655 912
603 689 373 710 684 252 414 374 805 472 794
377 615 713 690 455 605 429 223 928 806 484
714 835 796 435 663 606 430 692 809 619 319
721 378 459 716 239 437 696 960 837 810 488
722 667 461 380 621 247 783 467 817 838 627
812 679 622 737 724 899 438 669 441 841 818
462 351 469 575 367 738 629 670 442 728 842
683 791 820 251 901 630 470 740 849 415 496
844 633 483 711 824 902 685 444 473 850 375
795 744 634 253 691 905 686 607 254 807 865
852 636 715 485 906 431 797 752 693 474 379
913 866 798 486 694 908 856 717 489 811 476
381 697 623 723 914 868 718 439 490 698 839
463 813 671 929 916 382 725 872 819 497 700
814 443 631 492 739 930 726 920 843 498 880
821 729 961 741 471 822 730 845 825 851 846
745 445 742 932 635 255 962 826 903 687 500
732 853 637 446 746 867 907 695 475 719 753
936 854 487 909 944 748 828 504 869 799 699
477 857 910 915 964 873 491 638 754 968 727
478 917 858 701 756 383 921 870 815 874 976
493 931 918 702 860 731 499 823 881 933 743
494 847 501 922 827 760 447 733 876 934 963
882 937 924 992 855 747 502 829 734 965 938
505 884 639 911 830 749 506 859 479 945 755
966 871 940 750 969 888 508 861 946 919 757
703 970 875 495 862 948 758 977 923 761 972
877 935 978 883 503 952 762 925 735 878 993
980 939 885 926 831 764 507 994 967 886 941
751 984 889 509 947 996 942 971 890 510 863
949 759 1000 973 892 950 979 953 763 974 879
1008 981 954 927 765 995 982 887 956 766 985
997 943 986 891 511 998 1001 988 893 951
1002 975 894 1009 955 1004 1010 983 957 767
1012 958 987 999 1016 989 1003 990 895 1005
1011 1006 1013 959 1014 1017 1018 991 1020 1007
1015 1019 1021 1022 1023];

For example, if there are K=10 information bits, the information set A of size K=10 can be extracted from the sequence $S_{1024}{}^1$ above by taking the first K=10 indices of the sequence, i.e.

A={1023 1022 1021 1019 1015 1007 1020 991 1018 1017}.

Similarly, for another example, if there are K=16 information bits, the information set A of size K=16 can be extracted from the sequence $S_{512}{}^2$ above by taking the first K=16 indices of the sequence, i.e.

A={1023 1022 1021 1019 1015 1007 1020 991 1018 1017 1014 959 1013 1006 1011 1005}.

The indices in A specify the information bit locations where the data bits should be loaded for the Polar encoder, and they are also the location where the decoder should extract the data during an SC or SCL decoding process.

In some embodiments, the information bits are mapped to bit location with the highest reliability order, when not considering rate matching. When rate matching is used, some high reliability bit locations may be excluded. After that, the information bits are mapped to the high reliability locations among the remaining locations. In the examples below, rate matching is not considered.

Information bits and data are from the perspective of polar coding, i.e., bits to be carried by the polar code core. The information bits may include information of various content. For example, the information bits may include information payload bits and assistance bits. One example of assistance bits is CRC bits, where the CRC bits protect the information payload. Another example of the assistance bits are PC bits (i.e., parity-check bits) which are inserted to assist with the polar decoding.

Those skilled in the art will understand that, in some cases, the ordering of some small sub-group of bits within the above sequences may be swapped for provide incremental improvement in performance at certain operating points.

Particular embodiments include a method for generating the sequences. At a first step, particular embodiments, find a good length 128 sequence, written in the format of highest reliability to lowest reliability. For example:

N128_0=[127 126 125 123 119 111 95 124 63 122 121 118 117 110 115 109 94 107 93 62 103 61 120 91 87 116 114 59 108 79 113 55 106 92 47 102 105 90 31 101 89 86 60 99 85 58 78 112 57 83 54 77 46 53 104 75 51 100 71 45 30 88 43 98 29 84 39 97 27 82 56 76 23 52 15 81 74 50 44 73 70 42 49 69 28 41 67 26 38 96 37 25 22 35 80 21 14 72 19 13 48 68 11 40 7 66 36 24 65 34 20 33 18 12 17 10 6 9 5 64 3 32 16 8 4 2 1 0];

At a second step, particular embodiments find a good length 256 sequence, written in the format of highest reliability to lowest reliability. For example:

N256_0=[255 254 253 251 247 239 252 223 250 249 246 191 245 238 243 237 127 222 235 221 248 190 231 219 244 189 215 242 126 187 236 207 241 125 234 183 220 123 233 175 230 218 119 229 159 214 217 111 188 227 186 213 95 206 240 185 211 182 124 205 203 232 181 63 174 122 228 179 199 121 173 216 158 118 226 117 171 212 110 157 225 115 167 184 204 109 155 210 94 180 107 151 209 202 93 143 178 62 172 103 201 61 198 120 177 91 170 197 87 116 156 195 114 169 79 59 166 224 108 154 113 165 55 153 106 208 150 92 163 47 102 149 200 105 90 142 31 101 176 147 89 141 196 86 60 99 139 168 85 58 194 78 135 57 164 83 112 54 77 152 193 46 53 162 104 75 148 51 100 71 45 161 30 146 140 88 43 98 29 145 138 84 39 97 27 137 82 56 76 23 134 192 133 52 15 81 74 50 44 131 73 70 160 42 49 69 28 144 41 67 26 38 96 136 37 25 22 132 35 80 21 14 72 130 19 13 48 68 11 129 40 7 66 36 24 65 34 20 33 18 12 17 10 128 6 9 5 64 3 32 16 8 4 2 1 0];

At a third step, the N128_0 sequence may be nested into N256_0 to arrive at, written in the format of highest reliability to lowest reliability N256_1=[255 254 253 251 247 239 252 223 250 249 246 191 245 238 243 237 127 222 235 221 248 190 231 219 244 189 215 242 126 187 236 207 241 125 234 183 220 123 233 175 230 218 119 229 159 214 217 111 188 227 186 213 95 206 240 185 211 182 124 205 203 232 181 63 174 122 228 179 199 121 173 216 158 118 226 117 171 212 110 157 225 115 167 184 204 109 155 210 94 180 107 151 209 202 93 143 178 62 172 103 201 61 198 120 177 91 170 197 87 116 156 195 114 169 59 108 166 224 79 154 113 165 55 153 106 208 150 92 163 47 102 149 200 105 90 142 31 101 176 147 89 141 196 86 60 99 139 168 85 58 194 78 135 112 164 57 83 54 77 152 193 46 53 162 104 75 148 51 100 71 45 161 30 146 140 88 43 98 29 145 138 84 39 97 27 137 82 56 76 23 134 192 133 52 15 81 74 50 44 131 73 70 160 42 49 69 28 144 41 67 26 38 96 136 37 25 22 132 35 80 21 14 72 130 19 13 48 68 11 129 40 7 66 36 24 65 34 20 33 18 12 17 10 128 6 9 5 64 3 32 16 8 4 2 1 0];

At a fourth step, N256_1 may be further improved by swapping the entry 163 and 208 to arrive at N256_2 sequence. When writing the N256_2 sequence in the format of lowest reliability to highest reliability, we obtain $S_{256}^1$. $S_{128}^1$ is derivable from $S_{256}^1$ by taking the entries that are less than 256. For example, using pseudo-code (based on standard Matlab commands):

$$S_{128}^1 = S_{256}^1(\text{find}(S_{256}^1 < 128));$$

Then the $S_{256}^1$ sequence (which is equivalent to N256_2) is propagated into a length-512 sequence and a length-1024 sequence progressively to arrive at $S_{512}^1$ and $S_{1024}^1$, respectively. Note that in general, a sequence may be written in the format of lowest reliability to highest reliability, or written in the format of highest reliability to lowest reliability, and either way is equivalent.

Similar to how the length-128 sequence can be derived from the length-128 sequence, the length-512 sequence can be derived from the length-1024 sequence, and the length-256 sequence can be derived from the length-512 sequence.

$$S_{512}^1 = S_{1024}^1(\text{find}(S_{1024}^1 < 512));$$

$$S_{256}^1 = S_{512}^1(\text{find}(S_{512}^1 < 256));$$

Figure 3:
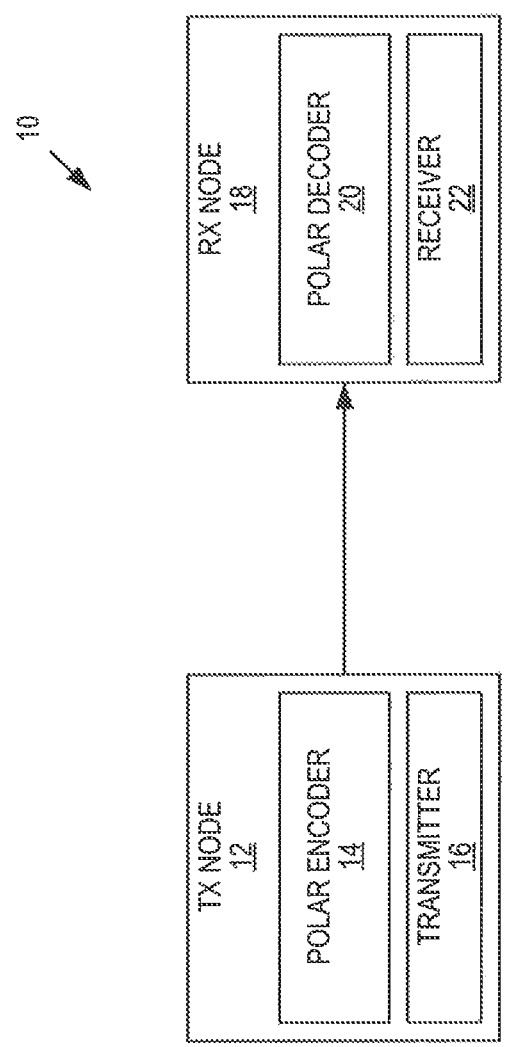
FIG. 3 illustrates one example of a system in which embodiments of the present disclosure may be implemented.

FIG. 3 illustrates a wireless communications system 10 including a transmit (TX) node 12 that includes a polar encoder 14 (i.e., a polar code encoder) and a transmitter 16, and a receive (RX) node 18 that includes a polar decoder 20 (i.e., a polar code decoder) and a receiver 22. The polar encoder 14 may be implemented in hardware or a combination of hardware and software (e.g., software stored on memory and executed by a processor(s)). The transmitter 16 includes various hardware components such as, e.g., Digital-to-Analog Converter(s) (DAC(s)), filter(s), mixer(s), amplifier(s), and/or the like. Likewise, the polar decoder 20 may be implemented in hardware or a combination of hardware and software (e.g., software stored on memory and executed by a processor(s)). The receiver 22 includes various hardware components such as, e.g., an Analog-to-Digital Converter(s) (ADC(s)), filter(s), mixer(s), amplifier(s), and/or the like. The wireless communications system 10 may be any type of wireless communications system such as, but not limited to, a cellular communications network in which the transmit node 12 is, e.g., a radio access node (e.g., a base station) and the receive node 18 is a wireless device or terminal (e.g., a UE), or vice versa.

Figure 4A:
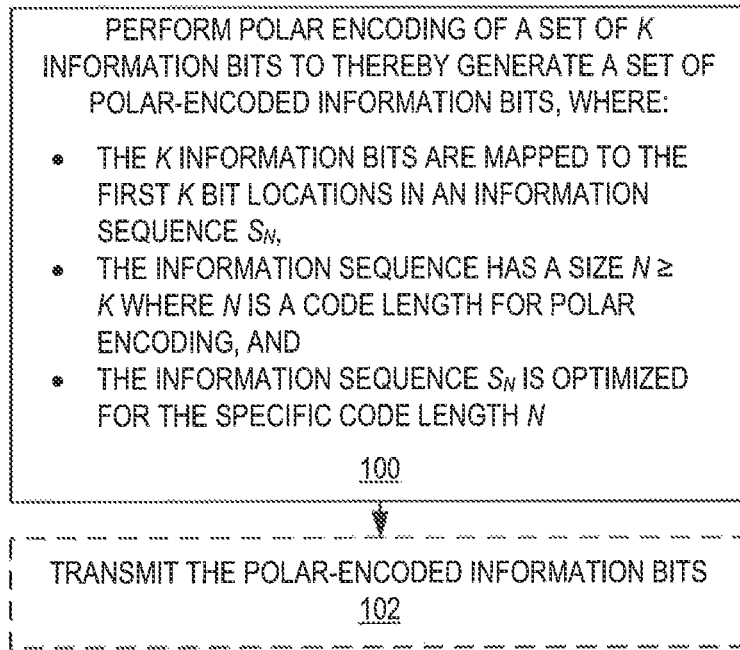
FIG. 4A is a flow chart that illustrates the operation of a transmit node in accordance with some embodiments of the present disclosure.

FIG. 4A is a flow chart that illustrates the operation of the transmit node 12 in accordance with some embodiments of the present disclosure. Optional steps are represented by a dashed box. As illustrated, the transmit node 12, and in particular the polar encoder 14, performs polar encoding of a set of K information bits to thereby generate a set of polar-encoded information bits (step 100). For polar encoding, there is a set of input bit locations for the polar encoder 14 consisting of N information bit (i.e., not frozen bit) locations and one or more non-information (i.e., frozen) bit locations, where N is the code length and N≥K. The N information bit locations are referred to as an information set. An information sequence SN (i.e., a ranking sequence of the information bit locations) is optimized for the specific code length N. The K information bits are mapped to the first K bit locations in the information sequence SN.

In some embodiments, N=128 and the information sequences SN are:

$S_{128}^1$ = [127 126 125 123 119 111 95 124 63 122 121 118 117 110 115 109 94 107 93
62 103 61 120 91 87 116 114 79 59 108 113 55 106 92 47 102 105 90 31 101 89 86
60 99 85 58 78 57 83 112 54 77 46 53 104 75 51 100 71 45 30 88 43 98 29 84 39 97
27 82 56 76 23 52 15 81 74 50 44 73 70 42 49 69 28 41 67 26 38 96 37 25 22 35 80
21 14 72 19 13 48 68 11 40 7 66 36 24 65 34 20 33 18 12 17 10 6 9 5 64 3 32 16 8 4 2
1 0];
$S_{128}^1$ = [0 1 2 4 8 16 32 3 64 5 6
9 10 17 12 18 33 20 34 65 24 36
66 7 11 40 68 13 19 48 72 14 21
80 35 22 25 37 96 38 26 67 41 28
69 42 49 70 73 44 50 74 81 15 52
23 76 56 82 27 97 39 84 29 98 43
88 30 45 71 100 51 75 104 46 53 77
54 83 57 112 78 58 85 99 60 86 89
101 31 90 105 102 47 92 106 55 113 79
108 59 114 116 87 91 120 61 103 62 93
107 94 109 115 110 117 118 121 122 63 124
95 111 119 123 125 126 127];

In some embodiments, N=256 and the information sequences SN are:

a) $S_{256}^1$ = [255 254 253 251 247 239 252 223 250 249 246 191 245 238 243
237 127 222 235 221 248 231 219 190 244 189 215 242 236 187 241 126
207 234 183 125 220 233 230 123 218 175 119 229 217 188 159 214 227
186 213 240 111 206 185 211 182 124 205 232 181 95 122 203 174 228
179 121 216 173 118 199 226 63 158 117 171 110 157 212 115 225 167
109 184 155 210 94 204 107 209 180 151 93 202 103 178 120 91 62 201
172 143 198 177 61 116 170 87 197 156 59 114 169 224 195 166 108 79
154 113 55 165 106 153 208 150 92 163 105 47 102 149 90 200 142 101
176 147 89 60 31 86 141 196 99 58 168 85 139 194 78 57 112 83
54 193 164 135 77 152 53 162 104 75 46 148 51 161 45 100 71 146
88 30 140 43 98 145 29 84 138 97 39 56 27 82 137 192 134 76 81
52 23 133 74 15 50 44 73 131 70 49 160 42 69 28 41 38 144 67
26 96 37 25 136 22 35 80 21 132 14 19 72 130 13 48 129 68 11
40 66 7 36 65 24 34 20 33 18 12 17 128 10 9 6 64 5 3 32
16 8 4 2 1 0];
b) $S_{256}^2$ = [255 254 253 251 247 239 252 223 250 249 246 191 245 238 243
237 127 222 235 221 248 231 219 190 244 189 215 242 236 187 241 126
207 234 183 125 220 233 230 123 218 175 119 229 217 188 159 214 227
186 213 240 111 206 185 211 182 124 205 232 181 95 122 203 174 228
179 121 216 173 118 199 226 63 158 117 171 110 157 212 115 225 167
109 184 155 210 94 204 107 209 180 151 93 202 120 178 103 91 62 201
172 143 198 177 116 61 170 87 197 156 114 108 169 224 195 166 59
113 154 79 55 165 106 153 208 150 92 163 105 47 102 149 90 200 142
31 176 147 101 89 99 60 141 196 86 85 168 58 139 194 112 78 57
83 54 193 164 135 77 152 104 162 53 75 46 148 100 161 51 88 45
146 71 98 140 30 43 145 84 97 138 29 56 82 39 76 137 192 134 27
81 52 74 133 23 50 73 44 15 131 70 49 160 42 69 28 41 96 144
67 38 26 37 25 136 80 22 35 21 132 14 19 72 130 13 48 129 68
11 40 66 7 36 65 24 34 20 33 18 12 17 128 10 9 6 64 5 3
32 16 8 4 2 1 0];
c) $S_{256}^3$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 108 169 224 195 166
59 113 154 79 55 165 106 153 208 150 92 163 105 47 102 149 90 200 142 31 176
147 101 89 99 60 141 196 86 85 168 58 139 194 112 78 57 83 54 193 164 135 77 152
104 162 53 75 46 148 100 161 51 88 45 146 71 98 140 30 43 145 84 97 138 29 56 82
39 76 137 192 134 27 81 52 74 133 23 50 73 44 15 131 70 49 160 42 69 28 41 96 144
67 38 26 37 25 136 80 22 35 21 132 14 19 72 130 13 48 129 68 11 40 66 7 36 65 24
34 20 33 18 12 17 128 10 9 6 64 5 3 32 16 8 4 2 1 0 ]
d) $S_{256}^4$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 59 169 224 195 166
108 79 154 113 55 165 106 153 208 150 92 163 47 105 102 149 90 200 142 101 176
147 89 99 60 31 141 196 86 58 168 85 139 194 78 112 57 83 54 193 164 135 77 152
104 162 53 75 46 148 100 161 51 88 45 146 71 98 140 30 43 145 84 29 138 97 56 82
39 27 137 192 134 76 81 52 74 133 23 50 73 44 70 131 15 49 160 42 69 28 96 41 144
67 38 26 80 37 136 25 22 35 72 132 21 14 48 130 68 19 129 13 66 11 40 7 36 24 65
34 20 33 18 12 17 128 10 9 64 6 5 3 32 16 8 4 2 1 0 ];
e) $S_{256}^5$ = [255 254 253 251 247 239 252 223 250 249 246 191 245 238 243 237 127 222

-continued 235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 108 169 224 195 166
59 113 154 79 55 165 106 153 208 150 92 163 105 47 102 149 90 200 142 31 176
147 101 89 99 60 141 196 86 85 168 58 139 194 112 78 57 83 54 193 164 135 77 152
104 162 53 75 46 148 100 161 51 88 45 146 71 98 140 30 43 145 84 97 138 29 39
137 82 56 134 76 27 81 133 52 74 23 192 50 73 44 15 131 70 49 160 42 69 28 41 96
144 67 38 26 37 25 136 80 22 35 21 132 14 19 72 130 13 48 129 68 11 40 66 7 36 65
24 34 20 33 18 12 17 128 10 9 6 64 5 3 32 16 8 4 2 1 0 ];
f) $S_{256}^6$ = [255 254 253 251 247 239 252 223 250 249 246 191 245 238 243 237 127 222
235 221 248 231 219 190 244 189 215 242 126 187 236 241 207 183 234 125 220
175 123 230 233 229 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 59 169 224 195 166
108 79 154 113 55 165 106 153 208 150 92 163 47 105 102 149 90 200 142 101 176
147 89 99 60 31 141 196 86 58 168 85 139 194 78 112 57 83 54 193 164 135 77 152
104 162 53 75 46 148 100 161 51 88 45 146 71 98 140 30 43 145 84 29 138 97 56
137 82 39 134 27 76 81 133 52 74 23 192 50 73 44 70 131 15 49 160 42 69 28 96 41
144 67 38 26 80 37 136 25 22 35 72 132 21 14 48 130 68 19 129 13 66 11 40 7 36 24
65 34 20 33 18 12 17 128 10 9 64 6 5 3 32 16 8 4 2 1 0];
g) $S_{256}^7$ = [255 254 253 251 247 239 252 223 250 249 246 191 245 238 243 237 127 222
235 221 248 231 219 190 244 189 215 242 126 187 236 241 207 175 234 125 220
183 123 229 233 230 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 197 156 114 108 169 224 195 166
59 113 154 79 55 165 106 153 208 150 92 163 105 47 102 149 90 200 142 31 176
147 101 89 99 60 141 196 86 85 168 58 139 194 112 78 57 83 54 193 164 135 77 152
104 162 53 75 46 148 100 161 51 88 45 146 71 98 140 30 43 145 84 97 138 29 56 82
39 76 137 192 134 27 81 52 74 133 23 50 73 44 15 131 70 49 160 42 69 28 41 96 144
67 38 26 37 25 136 80 22 35 21 132 14 19 72 130 13 48 129 68 11 40 66 7 36 65 24
34 20 33 18 12 17 128 10 9 6 64 5 3 32 16 8 4 2 1 0];
h) $S_{256}^8$ = [255 254 253 251 247 239 252 223 250 249 246 191 245 238 243 237 127 222
235 221 248 231 219 190 244 189 215 242 126 187 236 241 207 175 234 125 220
183 123 229 233 230 218 119 217 188 214 227 159 186 213 111 240 206 185 211
182 124 205 95 203 232 181 122 174 228 179 121 216 173 118 199 63 226 158 117
171 110 157 212 115 225 167 109 184 155 210 94 204 107 209 180 151 93 202 120
178 103 91 62 201 172 143 198 177 116 61 170 87 97 156 114 59 169 24 195 166
108 79 154 113 55 165 106 153 208 150 92 163 47 105 149 90 200 142 101 76
147 89 99 60 31 141 196 86 58 168 85 139 194 78 112 57 83 54 193 164 135 77 152
104 162 53 75 46 148 100 161 51 88 45 146 71 98 140 30 43 145 84 29 138 97 56 82
39 27 137 192 134 76 81 52 74 133 23 50 73 44 70 131 15 49 160 42 69 28 96 41 144
67 38 26 80 37 136 25 22 35 72 132 21 14 48 130 68 19 129 13 66 11 40 7 36 24 65
34 20 33 18 12 17 128 10 9 64 6 5 3 32 16 8 4 2 1 0 ];
i) $S_{256}^1$ = [255 254 253 251 247 239 252 223 250 249 246 191 245 238 243 237 127 222
235 221 248 190 231 219 244 189 215 242 126 187 236 207 241 125 234 183 220
123 233 175 230 218 119 229 159 214 217 111 188 227 186 213 95 206 240 185 211
182 124 205 203 232 181 63 174 122 228 179 199 121 173 216 158 118 226 117 171
212 110 157 225 115 167 184 204 109 155 210 94 180 107 151 209 202 93 143 178
62 172 103 201 61 198 120 177 91 170 197 87 116 156 195 114 169 59 108 166 224
79 154 113 165 55 153 106 208 150 92 163 47 102 149 200 105 90 142 31 101 176
147 89 141 196 86 60 99 139 168 85 58 194 78 135 112 164 57 83 54 77 152 193 46
53 162 104 75 148 51 100 71 45 161 30 146 140 88 43 98 29 145 138 84 39 97 27
137 82 56 76 23 134 192 133 52 15 81 74 50 44 131 73 70 160 42 49 69 28 144 41 67
26 38 96 136 37 25 22 132 35 80 21 14 72 130 19 13 48 68 11 129 40 7 66 36 24 65
34 20 33 18 12 17 10 128 6 9 5 64 3 32 16 8 4 2 1 0 ];
j) $S_{256}^1$ = [0 1 2 4 8 16 32 3 64 5 6
9 128 10 17 12 18 33 20 34 65 24
36 66 7 11 129 40 68 13 19 48 130
72 14 21 80 35 132 22 25 37 136 96
38 26 67 41 144 28 69 42 49 160 70
73 131 44 50 74 81 15 52 133 192 134
23 76 56 82 137 27 97 39 84 138 145
29 98 43 88 140 146 30 161 45 71 100
51 148 75 104 162 46 53 193 152 77 54
83 57 164 112 135 78 194 58 85 168 139
99 60 86 196 141 89 147 176 101 31 142
90 105 200 149 102 47 208 92 150 163 106
153 55 165 113 154 79 224 166 108 59 169
114 195 156 116 87 197 170 91 177 120 198
61 201 103 172 62 178 143 93 202 209 151
107 180 94 210 155 109 204 184 167 115 225
157 110 212 171 117 226 118 158 216 173 121
199 179 228 122 174 63 181 232 203 205 124
182 211 185 240 206 95 213 186 227 188 111
217 214 159 229 119 218 230 175 233 123 220

```
183 234 125 241 207 236 187 126 242 215 189
244 248 219 190 231 221 235 222 237 243 245
127 238 246 249 250 191 252 223 239 247 251
253 254 255];
```

In some embodiments, N=512 and the information sequence SN is:

```
S_512^1 = [0 1 2 4 8 16 32 3 64 5 6
9 128 256 10 17 12 18 33 20 34 65
24 36 66 7 11 129 40 68 257 13 19
48 130 72 14 258 21 80 260 35 132 22
25 264 37 136 96 272 38 26 67 41 144
28 288 69 42 49 160 70 73 131 44 50
320 74 81 15 52 384 133 192 134 23 76
56 82 137 27 259 97 261 39 84 138 145
29 98 262 265 43 88 140 146 30 161 45
71 100 266 273 51 148 268 75 104 162 46
274 53 193 152 289 276 77 54 83 57 164
112 135 78 194 290 280 58 321 85 168 292
139 322 99 60 86 196 296 141 89 263 385
324 147 176 101 31 142 304 90 328 105 386
200 149 102 47 208 92 267 150 163 388 106
153 336 55 269 165 113 154 79 224 275 392
270 352 166 400 108 59 169 114 195 156 116
277 278 87 197 170 291 416 281 293 91 177
120 198 61 282 201 448 294 103 172 62 178
143 284 323 93 202 297 209 151 298 107 180
94 325 210 305 300 326 155 109 204 184 387
306 271 329 167 115 225 330 157 110 212 308
389 337 332 312 171 117 226 279 118 158 216
390 338 393 173 121 353 340 199 394 283 179
228 122 174 63 181 232 295 203 205 285 124
182 354 211 401 299 185 240 206 95 344 356
402 286 417 327 301 396 307 213 186 418 360
227 309 331 188 111 449 302 217 214 159 404
333 408 310 368 229 119 339 218 313 230 420
175 334 391 450 341 233 123 220 183 314 395
424 355 234 125 241 345 342 452 397 287 207
432 316 357 403 236 187 346 398 361 126 242
456 405 215 189 244 358 303 362 464 419 406
348 248 219 409 311 421 369 190 231 480 335
410 425 370 315 221 422 364 235 317 451 343
412 222 433 453 372 237 426 243 454 347 376
428 457 318 359 245 127 238 465 434 399 458
363 349 407 436 246 350 249 460 411 365 440
371 481 250 423 466 413 366 468 191 482 427
373 252 414 374 472 377 455 429 223 484 435
430 319 378 459 239 437 488 461 380 247 467
438 441 462 351 469 367 442 251 470 415 496
483 444 473 375 253 254 485 431 474 379 486
489 476 381 439 490 463 382 497 443 492 498
471 445 255 500 446 475 487 504 477 491 478
383 493 499 494 501 447 502 505 506 479 508
495 503 507 509 510 511];
```

In some other embodiments, N=1024 and the information sequences $S_N$ are:

```
a) S_1024^1 = [1023 1022 1021 1019 1015 1007 1020 991 1018 1017
1014 959 1013 1006 1011 1005 895 990 1003 989
1016 999 987 958 1012 767 957 983 1010 1004 955
1009 894 975 1002 951 893 988 1001 998 511 891
986 943 997 985 766 956 887 982 995 765 927
954 981 1008 879 974 763 953 979 950 892 973
1000 759 949 863 510 890 971 942 996 947 509
889 984 751 941 886 967 994 507 764 831 926
885 939 980 993 878 735 925 762 952 503 883
978 935 877 972 761 923 977 758 948 862 495
875 970 703 757 919 946 861 508 888 969 750
940 871 966 755 945 479 859 506 749 830 911
639 884 505 938 965 734 829 502 747 855 992
924 937 882 963 934 876 733 447 760 827 922
501 743 494 881 847 731 933 702 499 976 874
921 823 756 918 931 860 493 873 968 701 870
727 917 754 944 383 478 858 491 815 748 699
477 910 869 753 964 638 915 504 719 857 828
909 746 854 936 487 867 962 695 475 637 732
799 446 745 826 853 907 500 880 961 742 932
846 255 445 635 730 825 920 471 687 851 498
741 822 903 930 845 492 872 729 443 700 497
631 726 821 916 739 929 382 463 843 490 814
671 868 698 725 439 752 819 914 381 476 856
489 623 718 813 908 839 697 486 866 723 913
694 379 474 636 717 798 431 485 254 811 607
744 375 693 852 473 906 444 865 634 797 470
715 253 686 483 960 415 824 807 905 691 850
740 633 442 469 902 795 367 685 844 630 251
728 711 496 575 462 849 820 441 738 901 670
467 629 438 683 842 380 791 928 461 247 724
622 737 818 351 669 488 899 437 841 627 812
378 696 679 838 459 621 722 430 817 783 667
239 716 435 912 484 377 810 837 606 721 429
374 692 619 472 455 864 319 796 714 252 809
663 482 605 414 835 373 806 427 904 690 223
632 615 468 713 794 366 684 481 250 413 710
603 805 574 371 689 848 655 440 423 900 793
365 466 628 249 682 709 790 411 573 460 246
803 599 736 191 350 668 465 898 436 363 681
```

```
840 626 789 707 245 678 571 458 620 407 816
349 782 897 666 238 625 434 591 376 787 359
677 836 457 243 720 428 618 781 567 454 347
665 237 318 433 399 808 662 127 604 675 834
372 617 426 453 222 779 317 614 235 712 343
661 480 559 412 833 602 804 425 370 688 221
654 451 613 422 315 792 364 775 248 659 231
708 601 410 572 369 802 335 653 598 219 421
190 611 464 543 362 680 311 788 409 706 244
801 570 597 406 651 189 348 419 896 361 215
624 590 705 786 358 676 569 456 242 405 595
303 780 566 187 346 664 236 647 432 589 398
785 357 126 241 674 207 616 403 565 452 345
778 316 234 397 183 342 660 587 125 558 355
673 832 287 424 220 777 563 450 612 233 314
341 774 395 557 658 230 123 600 583 368 175
334 652 449 218 420 313 542 339 229 610 310
773 555 119 657 391 408 333 217 188 159 214
541 596 309 227 650 418 609 360 800 111 331
551 302 771 186 568 213 404 539 594 649 307
704 417 206 646 588 301 356 185 240 327 211
182 124 402 593 344 564 784 95 205 535 286
645 396 586 299 354 181 401 122 232 562 672
285 340 203 174 643 394 585 556 353 776 527
582 295 179 121 561 312 63 118 173 283 228
338 393 448 554 199 390 581 332 216 158 117
171 279 110 308 337 540 226 656 772 157 553
389 115 330 550 579 212 608 109 167 225 306
538 770 155 271 184 300 329 387 549 416 94
648 210 326 107 305 537 204 769 534 592 298
93 151 547 180 209 325 644 284 103 202 533
400 297 62 91 120 178 294 323 526 352 584
642 143 172 201 282 531 560 198 61 177 293
525 392 87 641 116 281 580 170 197 278 59
336 291 523 156 552 388 114 169 578 79 277
108 166 195 224 55 154 270 113 519 328 386
548 577 165 275 106 304 536 768 153 269 385
92 150 546 208 47 324 105 163 102 532 267
296 149 545 90 322 142 101 200 530 31 60
89 147 263 176 292 321 524 86 640 141 280
99 529 196 58 290 85 522 139 168 78 276
194 57 289 521 54 83 112 518 576 77 135
164 193 274 53 152 268 517 384 46 75 273
104 162 51 266 515 148 544 45 161 71 100
265 30 88 146 262 43 320 140 98 528 29
145 261 84 39 138 97 27 56 259 288 520
82 137 76 134 192 23 52 81 516 133 74
272 50 514 15 44 73 131 160 70 49 264
513 42 69 28 144 260 41 38 67 96 26
258 37 136 25 257 22 80 35 132 21 14
72 130 19 48 512 13 129 68 11 40 66
736 65 24 256 34 20 33 18 12 128 17
10 9 6 64 5 3 32 16 8 4 2
1 0];
``` b) $S_{1024}{}^2$ = [1023 1022 1021 1019 1015 1007 1020 991 1018 1017
```
1014 959 1013 1006 1011 1005 895 990 1003 989
1016 999 987 958 1012 767 957 983 1010 1004 955
1009 894 975 1002 951 893 988 1001 998 511 891
986 943 997 985 766 956 887 982 995 765 927
954 981 1008 879 974 763 953 979 950 892 973
1000 759 949 863 510 890 971 942 996 947 509
889 984 751 941 886 967 994 507 764 831 926
885 939 980 993 878 735 925 762 952 503 883
978 935 877 972 761 923 977 758 948 862 495
875 970 703 757 919 946 861 508 888 969 750
940 871 966 755 945 479 859 506 749 830 911
639 884 505 938 965 734 829 502 747 855 992
924 937 882 963 934 876 733 447 760 827 922
501 743 494 881 847 731 933 702 499 976 874
921 823 756 918 931 860 493 873 968 701 870
727 917 754 944 383 478 858 491 815 748 699
477 910 869 753 964 638 915 504 719 857 828
909 746 854 936 487 867 962 695 475 637 732
799 446 745 826 853 907 500 880 961 742 932
846 255 445 635 730 825 920 471 687 851 498
741 822 903 930 845 492 872 729 443 700 497
631 726 821 916 739 929 382 463 843 490 814
671 868 698 725 439 752 819 914 381 476 856
489 623 718 813 908 839 697 486 866 723 913
```

-continued

```
694 379 474 636 717 798 431 485 254 811 607
744 375 693 852 470 906 253 865 634 797 473
715 415 686 483 960 444 824 807 905 691 850
740 633 251 462 902 795 367 685 844 630 442
728 711 496 575 438 849 820 469 738 901 670
441 629 351 683 842 467 791 928 461 247 724
622 737 818 488 669 380 899 484 841 627 812
437 696 679 838 319 621 722 459 817 783 667
430 716 239 912 378 455 810 837 606 721 435
429 692 619 374 472 864 377 796 714 414 809
663 252 605 223 835 468 806 373 904 690 427
632 615 482 713 794 413 684 481 250 366 710
603 805 574 423 689 848 655 440 350 900 793
466 460 628 411 682 709 790 249 573 371 365
803 599 736 458 407 668 246 898 363 191 681
840 626 789 707 436 678 571 399 620 434 816
349 782 897 666 245 625 465 591 359 787 318
677 836 457 428 720 238 618 781 567 376 347
665 454 243 426 237 808 662 127 604 675 834
372 617 453 433 222 779 480 614 317 712 412
661 343 559 425 833 602 804 235 370 688 451
654 422 613 221 364 792 315 775 248 659 410
708 601 335 572 231 802 421 653 598 369 311
219 611 348 543 190 680 406 788 419 706 464
801 570 597 362 651 303 358 409 896 244 189
624 590 705 786 346 676 569 405 215 456 595
242 780 566 126 361 664 452 647 403 589 398
785 345 187 287 674 357 616 316 565 236 432
778 397 342 424 241 207 660 587 183 558 395
673 832 355 234 125 777 563 341 612 220 175
391 774 314 557 658 450 123 600 583 420 230
334 652 339 233 229 218 542 368 313 610 449
773 555 408 657 310 333 217 309 331 418 360
541 596 119 188 650 214 609 227 800 302 307
551 159 771 404 568 417 186 539 594 649 213
704 301 327 646 588 111 356 402 396 299 344
286 401 354 593 240 564 784 206 185 535 211
645 182 586 124 205 285 394 340 353 562 672
295 95 203 232 643 181 585 556 122 776 527
582 174 393 283 561 338 390 312 332 228 179
121 337 389 554 308 279 581 216 173 118 199
330 63 226 158 117 540 171 656 772 306 553
329 212 387 550 579 225 608 110 157 326 300
538 770 271 305 448 325 298 184 549 115 210
648 167 109 204 155 537 209 769 534 592 297
180 94 547 107 284 202 644 151 323 416 533
294 178 93 282 293 400 281 120 526 201 584
642 172 103 352 336 531 560 198 177 91 62
525 143 278 641 291 392 580 116 170 197 61
277 388 523 270 552 275 328 386 578 224 156
87 169 114 269 195 166 108 59 519 154 113
548 577 79 55 304 267 536 768 324 385 208
165 106 546 153 150 163 92 105 296 532 322
263 200 545 149 292 321 280 176 530 47 102
90 142 290 196 147 60 524 101 640 89 141
276 529 168 99 289 194 522 31 86 85 58
139 274 268 521 112 193 164 518 576 78 57
152 83 54 135 273 162 517 77 266 104 53
148 161 75 46 515 265 544 100 51 146 262
88 45 140 71 98 145 43 30 261 528 84
138 384 97 29 39 259 320 288 192 137 520
82 56 134 76 27 81 52 133 516 272 160
74 23 514 50 131 73 44 49 70 15 264
513 144 42 69 28 41 260 96 136 67 38
26 37 258 132 25 80 22 35 257 130 21
14 48 129 72 512 19 13 68 11 40 66
36 7 65 24 34 20 33 256 128 18 12
17 10 9 6 64 5 3 32 16 8 4
2 1 0];
c) $S_{1024}^3$ = [1023 1022 1021 1019 1015 1007 1020 991 1018 1017
1014 959 1013 1006 1011 1005 895 990 1003 989
1016 999 987 958 1012 767 957 983 1010 1004 955
1009 894 975 1002 951 893 988 1001 998 511 891
986 943 997 985 766 956 887 982 995 765 927
954 981 1008 879 974 763 953 979 950 892 973
1000 759 949 863 510 890 971 942 996 947 509
889 984 751 941 886 967 994 507 764 831 926
885 939 980 993 878 735 925 762 952 503 883
978 935 877 972 761 923 977 758 948 862 495
```

-continued

```
875 970 703 757 919 946 861 508 888 969 750
940 871 966 755 945 479 859 506 749 830 911
639 884 505 938 965 734 829 502 747 855 992
924 937 882 963 934 876 733 447 760 827 922
501 743 494 881 847 731 933 702 499 976 874
921 823 756 918 931 860 493 873 968 701 870
727 917 754 944 383 478 858 491 815 748 699
477 910 869 753 964 638 915 504 719 857 828
909 746 854 936 487 867 962 695 475 637 732
799 446 745 826 853 907 500 880 961 742 932
846 255 445 635 730 825 920 471 687 851 498
741 822 903 930 845 492 872 729 443 700 497
631 726 821 916 739 929 382 463 843 490 814
671 868 698 725 439 752 819 914 381 476 856
489 623 718 813 908 839 697 486 866 723 913
694 379 474 636 717 798 431 485 254 811 607
744 375 693 852 470 906 253 865 634 797 473
715 415 686 483 960 444 824 807 905 691 850
740 633 251 462 902 795 367 685 844 630 442
728 711 496 575 438 849 820 469 738 901 670
441 629 351 683 842 467 791 928 461 247 724
622 737 818 488 669 380 899 484 841 627 812
437 696 679 838 319 621 722 459 817 783 667
430 716 239 912 378 455 810 837 606 721 435
429 692 619 374 472 864 377 796 714 414 809
663 252 605 223 835 468 806 373 904 690 427
632 615 482 713 794 413 684 481 250 366 710
603 805 574 423 689 848 655 440 350 900 793
466 460 628 411 682 709 790 249 573 371 365
803 599 736 458 407 668 246 898 363 191 681
840 626 789 707 436 678 571 399 620 434 816
349 782 897 666 245 625 465 591 359 787 318
677 836 457 428 720 238 618 781 567 376 347
665 454 243 426 237 808 662 127 604 675 834
372 617 453 433 222 779 480 614 317 712 412
661 343 559 425 833 602 804 235 370 688 451
654 422 613 221 364 792 315 775 248 659 410
708 601 335 572 231 802 421 653 598 369 311
219 611 348 543 190 680 406 788 419 706 464
801 570 597 362 651 303 358 409 896 244 189
624 590 705 786 346 676 569 405 215 456 595
242 780 566 126 361 664 452 647 403 589 398
785 345 187 287 674 357 616 316 565 236 432
778 397 342 424 241 207 660 587 183 558 395
673 832 355 234 125 777 563 341 612 220 175
391 774 314 557 658 450 123 600 583 420 230
334 652 339 233 229 218 542 368 313 610 449
773 555 408 657 310 333 119 309 331 418 360
541 596 217 188 650 214 609 227 800 302 307
551 159 771 404 568 417 186 539 594 649 213
704 301 327 646 588 111 356 402 396 299 344
286 401 354 593 240 564 784 206 185 535 211
645 182 586 124 205 285 394 340 353 562 672
295 95 203 232 643 181 585 556 122 776 527
582 174 393 283 561 338 390 312 332 228 179
121 337 389 554 308 279 581 216 173 118 199
330 63 226 158 117 540 171 656 772 306 553
329 110 387 550 579 157 608 212 115 326 300
538 770 271 305 448 325 298 225 549 167 109
648 184 155 210 94 537 204 769 534 592 297
107 209 547 180 284 151 644 93 323 416 533
294 202 120 282 293 400 281 178 526 103 584
642 91 62 352 336 531 560 201 172 143 198
525 177 278 641 291 392 580 116 61 170 87
277 388 523 270 552 275 328 386 578 197 156
114 108 169 269 224 195 166 59 519 113 154
548 577 79 55 304 267 536 768 324 385 165
106 153 546 208 150 92 163 105 296 532 322
263 47 545 102 292 321 280 149 530 90 200
142 31 290 176 147 101 524 89 640 99 60
276 529 141 196 289 86 522 85 168 58 139
194 274 268 521 112 78 57 518 576 83 54
193 164 135 77 273 152 517 104 266 162 53
75 46 148 100 515 265 544 161 51 88 262
45 146 71 98 140 30 43 145 261 528 84
97 384 138 29 56 259 320 288 82 39 520
76 137 192 134 27 81 52 74 516 272 133
23 50 514 73 44 15 131 70 49 160 264
513 42 69 28 41 96 260 144 67 38 26
```

```
37 25 258 136 80 22 35 21 257 132 14
19 72 130 13 512 48 129 68 11 40 66
736 65 24 34 20 33 256 18 12 17 128
10 9 6 64 5 3 32 16 8 4 2
1 0];
```
d) $S_{1024}^4 = $ [1023 1022 1021 1019 1015 1007 1020 991 1018 1017
1014 959 1013 1006 1011 1005 895 990 1003 989
1016 999 987 958 767 1012 957 983 1010 955
1004 894 1009 975 1002 951 893 511 988 1001 998
891 943 986 997 766 887 985 956 982 765 995
927 954 981 879 763 1008 974 953 979 950 892
973 759 510 863 1000 949 890 971 509 942 751
947 996 889 941 886 507 984 967 831 764 994
926 885 939 735 503 980 878 993 762 925 883
952 935 877 978 761 923 495 972 758 703 862
977 948 875 757 970 508 919 861 750 946 479
888 871 969 755 940 506 966 859 749 830 945
911 639 884 505 938 965 734 829 502 747 855
992 447 924 937 882 733 963 501 934 827 876
760 743 922 494 881 847 731 933 702 499976
874 921 823 756 918 931 860 493 873 968 701
870 727 917 754 944 383 478 858 491 815 748
699 477 910 869 753 964 638 915 504 719 857
828 909 746 854 936 487 867 962 695 475 637
732 799 446 745 826 853 907 500 880 961 742
932 846 255 445 635 730 825 920 471 687 851
498 741 822 903 930 845 492 872 729 443 700
497 631 726 821 916 739 929 382 463 843 490
814 671 868 698 725 439 752 819 914 381 476
856 489 623 718 813 908 839 697 486 866 723
913 694 379 474 636 717 798 431 485 254 811
607 744 375 693 852 473 906 444 865 634 797
470 715 253 686 483 960 415 824 807 905 691
850 740 633 442 469 902 795 367 685 844 630
251 728 711 496 575 462 849 820 441 738 901
670 467 629 438 683 842 380 791 928 461 247
724 622 737 818 351 669 488 899 437 841 627
812 378 696 679 838 459 621 722 430 817 783
667 239 716 435 912 484 377 810 837 606 721
429 374 692 619 472 455 864 319 796 714 252
809 663 482 605 414 835 373 806 427 904 690
223 632 615 468 713 794 366 684 481 250 413
710 603 805 574 371 689 848 655 440 423 900
793 365 466 628 249 682 709 790 411 573 460
246 803 599 736 191 350 668 465 898 436 363
681 840 626 789 707 245 678 571 458 620 407
816 349 782 897 666 238 625 434 591 376 787
359 677 836 457 243 720 428 618 781 567 454
347 665 237 318 433 399 808 662 127 604 675
834 372 617 426 453 222 779 317 614 235 712
343 661 480 559 412 221 602 425 370 833 315
804 654 451 688 613 422 364 231 248 335 219
775 190 659 410 601 572 369 792 543 598 653
311 708 421 611 362 802 189 244 409 464 570
215 680 406 597 348 788 651 706 419 361 801
590 303 358 187 242 569 624 405 126 595 236
346 566 705 456 676 786 896 207 647 398 589
357 780 241 664 432 183 125 403 345 565 316
785 234 674 616 287 342 397 452 587 558 355
778 220 660 123 233 563 314 673 424 341 175
230 395 450 557 612 777 832 583 334 218 774
658 600 313 368 119 542 229 339 652 310 449
420 555 610 391 333 217 773 188 657 408 159
214 541 596 309 227 650 418 609 360 800 111
331 551 302 771 186 568 213 404 539 594 649
307 704 417 206 646 588 301 356 185 240 327
211 182 124 402 593 344 564 784 95 205 535
286 645 396 586 299 354 181 401 122 232 562
672 285 340 203 174 643 394 585 556 353 776
527 582 295 179 121 561 312 63 118 173 283
228 338 199 393 158 117 554 216 332 390 581
171 448 279 110 308 337 540 226 656 772 157
553 389 115 330 550 579 212 608 109 167 225
306 538 770 155 271 184 300 329 387 549 416
94 648 210 326 107 305 537 204 769 534 592
298 93 151 547 180 209 325 644 284 103 202
533 400 297 62 91 120 178 294 323 526 352
584 642 143 172 201 282 531 560 198 61 177
293 525 392 87 641 116 281 580 170 197 278

59 336 291 523 156 114 79 169 55 108 166
277 552 195 388 154 578 113 270 224 519 165
106 275 328 386 548 47 153 577 269 92 304
150 536 105 163 385 102 208 324 546 768 267
149 90 532 31 296 142 101 545 322 60 89
147 200 263 86 141 530 176 99 292 321 524
58 280 85 196 529 640 139 78 290 522 57
168 54 83 276 194 77 289 135 112 521 518
53 164 193 274 46 152 576 75 268 517 51
104 162 273 384 45 266 148 71 515 161 30
100 544 43 265 88 146 262 29 140 98 320
39 145 261 84 528 27 138 97 56 259 82
137 23 76 288 134 520 52 81 192 133 74
516 15 50 272 44 73 131 70 514 49 160
42 264 69 513 28 41 38 144 67 260 26
96 37 258 25 136 22 35 257 80 21 132
14 19 72 130 13 48 129 68 512 11 40
66 736 65 24 34 256 20 33 18 12 17
128 10 9 6 64 5 3 32 16 8 4
2 1 0];

e) $S_{1024}^5$ = [ 1023 1022 1021 1019 1015 1007 1020 991 1018 1017 1014 959 1013 1006
1011 1005 895 990 1003 989 1016 999 987 958 767 1012 957 983 1010 955 1004
894 1009 975 1002 951 893 511 988 1001 998 891 943 986 997 766 887 985 956 982
765 995 927 954 981 879 763 1008 974 953 979 950 892 973 759 510 863 1000 949
890 971 509 942 751 947 996 889 941 886 507 984 967 831 764 994 926 885 939
735 503 980 878 993 762 925 883 952 935 877 978 761 923 495 972 758 703 862
977 948 875 757 970 508 919 861 750 946 479 888 871 969 75 5 940 506 966 859
749 830 945 911 639 884 505 938 965 734 829 502 747 855 992 447 924 937 882
733 963 501 934 827 876 760 743 922 494 881 847 731 933 702 499 976 874 921
823 756 918 931 860 493 873 968 701 870 727 917 754 944 383 478 858 491 815
748 699 477 910 869 753 964 638 915 504 719 857 828 909 746 854 936 487 867
962 695 475 637 732 799 446 745 826 853 907 500 880 961 742 932 846 255 445
635 730 825 920 471 687 851 498 741 822 903 930 845 492 872 729 443 700 497
631 726 821 916 739 929 382 463 843 490 814 671 868 698 725 439 752 819 914
381 476 856 489 623 718 813 908 839 697 486 866 723 913 694 379 474 636 717
798 431 485 254 811 607 744 375 693 852 470 906 253 865 634 797 473 715 415
686 483 960 444 824 807 905 691 850 740 633 251 462 902 795 367 685 844 630
442 728 711 496 575 438 849 820 469 738 901 670 441 629 351 683 842 467 791
928 461 247 724 622 737 818 488 669 380 899 484 841 627 812 437 696 679 838
319 621 722 459 817 783 667 430 716 239 912 378 455 810 837 606 721 435 429
692 619 374 472 864 377 796 714 414 809 663 252 605 223 835 468 806 373 904
690 427 632 615 482 713 794 413 684 481 250 366 710 603 805 574 423 689 848
655 440 350 900 793 466 460 628 411 682 709 790 249 573 371 365 803 599 736
458 407 668 246 898 363 191 681 840 626 789 707 436 678 571 399 620 434 816
349 782 897 666 245 625 465 591 359 787 318 677 836 457 428 720 238 618 781
567 376 347 665 454 243 426 237 808 662 127 604 675 834 372 617 453 433 222
779 480 614 317 712 412 661 343 559 425 235 602 370 451 833 422 804 654 221
688 613 364 315 248 410 335 231 775 421 659 369 601 572 311 792 543 598 653
219 708 348 611 190 802 406 419 464 362 570 303 680 358 597 409 788 651 706
244 189 801 590 346 405 215 456 569 624 242 126 595 361 452 566 705 403 676
786 896 398 647 345 589 187 780 287 664 357 316 236 432 397 565 342 785 424
674 616 241 207 183 395 587 558 355 778 234 660 125 341 563 220 673 175 391
314 450 123 420 557 612 777 832 583 230 334 774 658 600 339 233 229 542 218
368 652 313 449 408 555 610 310 333 119 773 309 657 331 418 360 541 596 217
188 650 214 609 227 800 302 307 551 159 771 404 568 417 186 539 594 649 213
704 301 327 646 588 111 356 402 396 299 344 286 401 354 593 240 564 784 206
185 535 211 645 182 586 124 205 285 394 340 353 562 672 295 95 203 232 643 181
585 556 122 776 527 582 174 393 283 561 338 390 312 332 228 179 121 337 389
308 279 554 216 173 118 581 199 330 63 226 158 117 540 171 656 772 306 553 329
110 387 550 579 157 608 212 115 326 300 538 770 271 305 448 325 298 225 549
167 109 648 184 155 210 94 537 204 769 534 592 297 107 209 547 180 284 151 644
93 323 416 533 294 202 120 282 293 400 281 178 526 103 584 642 91 62 352 336
531 560 201 172 143 198 525 177 278 641 291 392 580 116 61 170 87 277 388 523
270 275 328 386 197 156 114 108 552 169 269 224 578 195 166 59 519 113 154 79
55 304 548 267 324 577 385 165 106 153 536 208 150 92 163 105 296 546 768 322
263 47 532 102 292 321 280 545 149 90 200 142 31 290 176 147 530 101 89 99 60
524 276 141 196 289 529 640 86 85 168 522 58 139 194 274 268 112 78 57 83 54
521 518 193 164 135 77 273 152 576 104 266 517 162 53 75 46 148 100 265 161 51
515 88 262 45 544 146 71 98 140 30 43 145 261 84 97 384 138 29 528 56 259 320
288 82 39 76 137 192 134 27 520 81 52 74 272 133 516 23 50 73 44 15 131 70 514
49 160 264 42 69 513 28 41 96 260 144 67 38 26 37 25 258 136 80 22 35 21 257 132
14 19 72 130 13 48 129 68 512 11 40 66 7 36 65 24 34 20 33 256 18 12 17 128 10 9 6
64 5 3 32 16 8 4 2 1 0];

f) $S_{1024}^1$ = [0 1 2 4 8 16 32 3 64 5 6
9 128 256 10 17 12 512 18 33 20 34
65 24 36 66 7 11 129 40 68 257 13
19 48 130 72 14 258 21 80 260 35 132
22 25 264 513 37 136 96 272 38 26 67
514 41 144 28 288 69 516 42 49 160 70

-continued

```
73 131 44 50 320 520 74 81 15 52 384
133 192 528 134 23 76 56 82 137 27 259
544 97 261 39 84 138 145 29 98 262 265
43 88 576 140 146 30 161 45 71 515 100
266 273 51 640 148 268 75 104 162 46 517
274 53 193 152 289 768 276 77 54 83 518
57 521 164 112 135 78 194 290 280 522 58
321 85 168 292 139 322 99 529 60 86 524
196 296 141 89 263 385 530 324 147 176 101
31 142 304 90 545 532 328 105 386 200 149
102 47 208 546 92 267 150 536 163 388 106
153 336 55 548 269 577 165 113 154 79 519
224 275 392 270 352 166 578 400 552 108 59
169 114 195 156 116 277 278 641 523 580 87
560 197 170 291 416 281 293 91 177 120 198
584 642 61 282 525 201 448 294 103 172 531
62 526 769 644 592 178 143 284 323 93 202
297 209 151 298 107 533 180 770 648 608 94
325 210 305 547 534 300 326 155 109 204 537
772 184 387 306 271 329 656 167 115 225 330
549 157 110 538 212 308 389 337 672 776 332
550 312 171 117 579 226 540 279 118 553 158
216 390 338 393 173 121 353 784 704 581 554
340 199 394 283 179 228 122 174 527 561 582
63 556 181 232 295 203 205 285 124 643 182
800 585 562 354 211 401 299 185 240 206 586
95 564 535 344 645 356 402 286 832 417 327
593 588 301 396 307 568 646 213 186 418 360
594 227 309 539 331 188 771 896 649 111 449
302 217 214 159 404 551 609 596 333 408 650
541 310 368 229 773 119 339 218 313 230 420
657 610 542 652 600 175 334 391 450 341 555
233 123 774 658 220 612 183 314 777 395 424
355 234 125 583 241 557 345 342 452 673 660
616 563 778 397 287 207 558 432 316 357 674
403 236 187 664 785 587 624 346 780 398 565
361 126 242 456 405 676 705 215 786 189 244
566 358 589 647 303 362 464 569 419 706 680
595 406 348 590 801 788 248 219 409 570 311
421 543 708 369 802 651 688 597 190 792 231
480 572 335 410 425 370 315 611 598 804 833
712 221 422 653 364 601 235 317 775 451 343
659 412 222 433 453 613 559 654 834 808 602
720 372 237 426 614 243 454 604 897 661 836
816 347 779 617 376 428 457 736 318 359 245
675 567 662 127 238 840 465 618 898 434 399
665 781 458 591 625 363 620 349 677 407 436
787 666 246 782 571 900 848 350 249 626 460
411 678 365 707 668 789 440 681 573 371 628
599 481 250 904 864 423 803 574 466 790 413
366 468 191 709 682 482 632 427 793 655 912
603 689 373 710 684 252 414 374 805 472 794
377 615 713 690 455 605 429 223 928 806 484
714 835 796 435 663 606 430 692 809 619 319
721 378 459 716 239 437 696 960 837 810 488
722 667 461 380 621 247 783 467 817 838 627
812 679 622 737 724 899 438 669 441 841 818
462 351 469 575 367 738 629 670 442 728 842
683 791 820 251 901 630 470 740 849 415 496
844 633 483 711 824 902 685 444 473 850 375
795 744 634 253 691 905 686 607 254 807 865
852 636 715 485 906 431 797 752 693 474 379
913 866 798 486 694 908 856 717 489 811 476
381 697 623 723 914 868 718 439 490 698 839
463 813 671 929 916 382 725 872 819 497 700
814 443 631 492 739 930 726 920 843 498 880
821 729 961 741 471 822 730 845 825 851 846
745 445 742 932 635 255 962 826 903 687 500
732 853 637 446 746 867 907 695 475 719 753
936 854 487 909 944 748 828 504 869 799 699
477 857 910 915 964 873 491 638 754 968 727
478 917 858 701 756 383 921 870 815 874 976
493 931 918 702 860 731 499 823 881 933 743
494 847 501 922 827 760 447 733 876 934 963
882 937 924 992 855 747 502 829 734 965 938
505 884 639 911 830 749 506 859 479 945 755
966 871 940 750 969 888 508 861 946 919 757
703 970 875 495 862 948 758 977 923 761 972
877 935 978 883 503 952 762 925 735 878 993
```

-continued

```
980 939 885 926 831 764 507 994 967 886 941
751 984 889 509 947 996 942 971 890 510 863
949 759 1000 973 892 950 979 953 763 974 879
1008 981 954 927 765 995 982 887 956 766 985
997 943 986 891 511 998 1001 988 893 951
1002 975 894 1009 955 1004 1010 983 957 767
1012 958 987 999 1016 989 1003 990 895 1005
1011 1006 1013 959 1014 1017 1018 991 1020 1007
1015 1019 1021 1022 1023];
```

Optionally, the transmit node 12, and more specifically the transmitter 16, transmits the polar-encoded information bits (step 102). Notably, other optional steps (e.g., rate-matching) may be performed after polar encoding and prior to transmission.

Figure 4B:
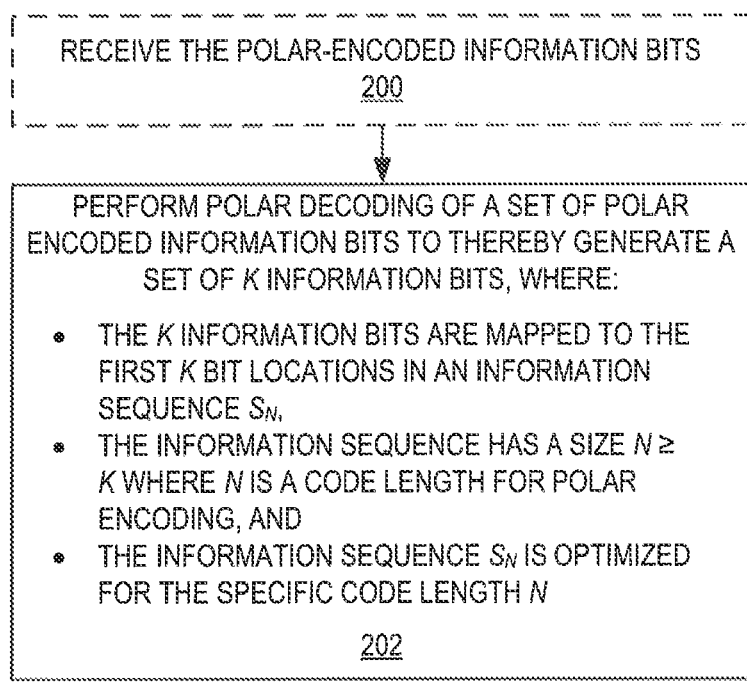
FIG. 4B is a flow chart that illustrates the operation of a receive node in accordance with some embodiments of the present disclosure.

FIG. 4B is a flow chart that illustrates the operation of the receive node 18 in accordance with some embodiments of the present disclosure. Optional steps are represented by a dashed box. As illustrated, the receive node 18, and in particular the polar decoder 20, performs polar decoding of a set of polar encoded information bits to thereby generate a set of K information bits (step 202). The polar encoded bits may have been generated according to step 100 described with respect to FIG. 4A.

Optionally, the receive node 18, and more specifically the receiver 22, receives the polar-encoded information bits (step 200). Notably, other optional steps may be performed after receiving and before polar decoding.

Figure 5:
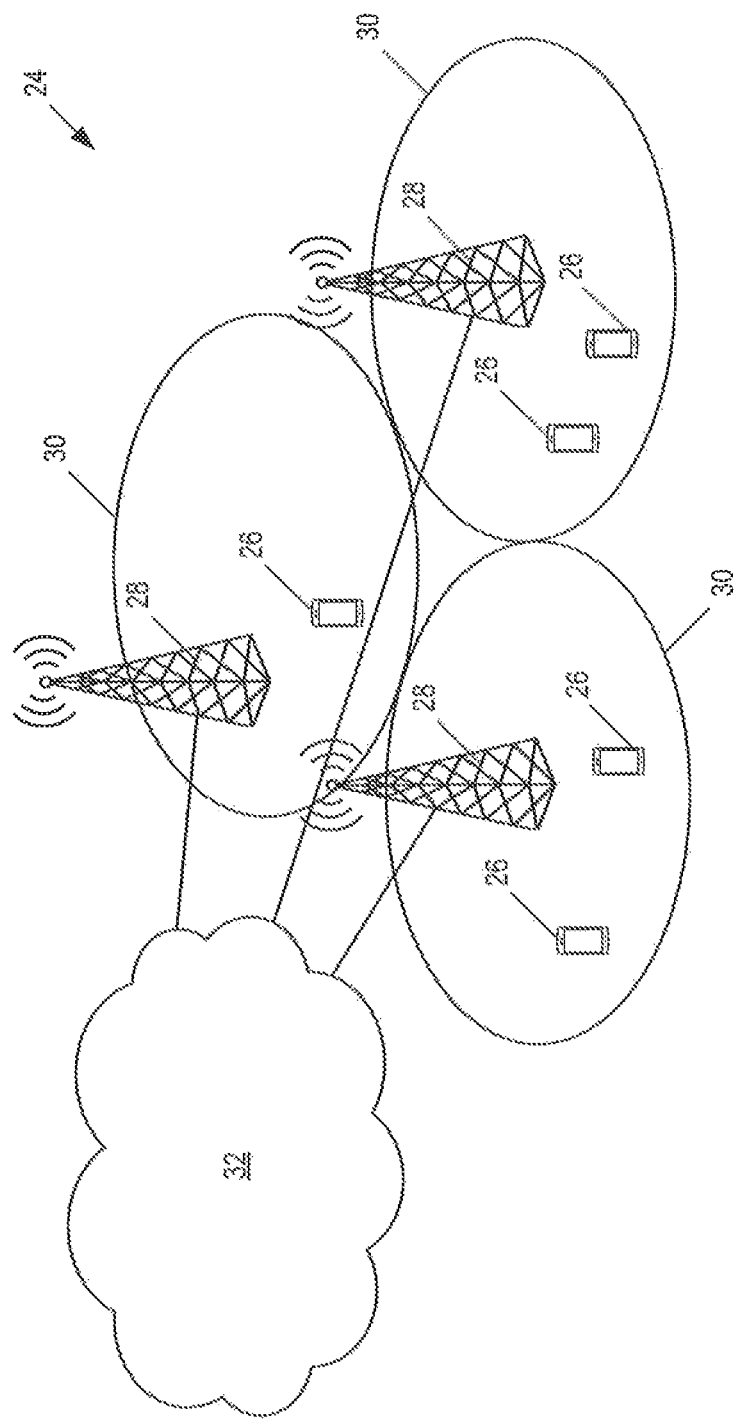
FIG. 5 illustrates one example of a wireless communication system in which embodiments of the present disclosure may be implemented.

FIG. 5 illustrates one example of a wireless communication system 24 in which embodiments of the present disclosure may be implemented. The wireless communication system 24 is preferably a 3GPP 5G NR system, but is not limited thereto. As illustrated, the wireless communication system 24 includes a number of wireless communication devices 26, which are also referred to herein as UEs. In addition, the wireless communication system 24 includes a radio access network that includes a number of radio access nodes 28 (e.g., gNBs) serving corresponding coverage areas or cells 30. The radio access nodes 28 are connected to a core network 32, which includes a number of core network nodes, as will be appreciated by one of skill in the art.

As an example, the radio access node 28 and/or the wireless communication device 26 may operate as the transmit node 12 described above.

Figure 6:
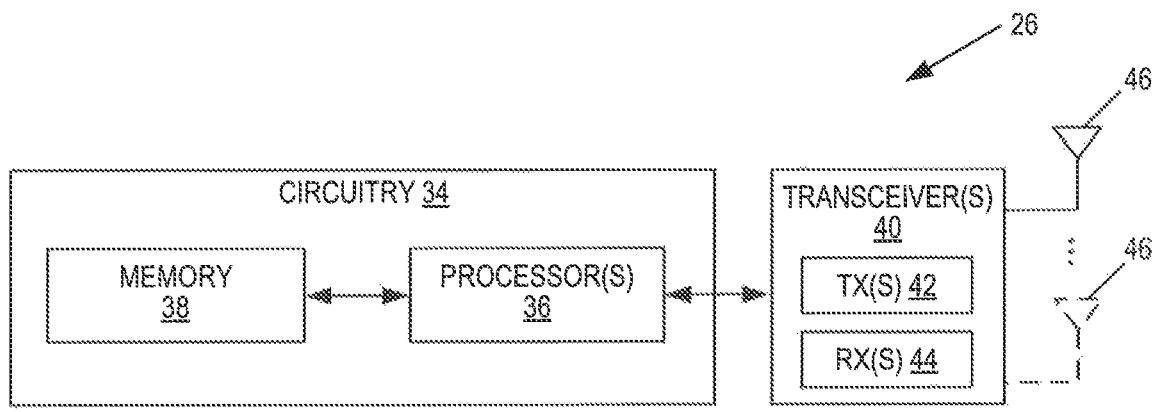
FIGS. 6 and 7 illustrate example embodiments of a wireless communication device.

FIG. 6 is a schematic block diagram of the wireless communication device 26, or UE, according to some embodiments of the present disclosure. As illustrated, the wireless communication device 26 includes circuitry 34 comprising one or more processors 36 (e.g., Central Processing Units (CPUs), Application Specific Integrated Circuits (ASICs), Field Programmable Gate Arrays (FPGAs), Digital Signal Processors (DSPs), and/or the like) and memory 38. The wireless communication device 26 also includes one or more transceivers 40 each including one or more transmitters 42 and one or more receivers 44 coupled to one or more antennas 46. In some embodiments, the functionality of the wireless communication device 26 described herein may be implemented in hardware (e.g., via hardware within the circuitry 34 and/or within the processor(s) 36) or be implemented in a combination of hardware and software (e.g., fully or partially implemented in software that is, e.g., stored in the memory 38 and executed by the processor(s) 36).

In some embodiments, a computer program including instructions which, when executed by the at least one processor 36, causes the at least one processor 36 to carry out at least some of the functionality of the wireless communication device 26 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 7:
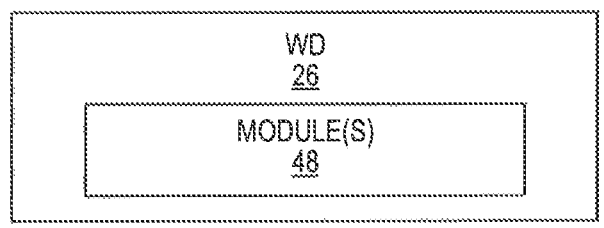

FIG. 7 is a schematic block diagram of the wireless communication device 26, or UE, according to some other embodiments of the present disclosure. The wireless communication device 26 includes one or more modules 48, each of which is implemented in software. The module(s) 48 provide the functionality of the wireless communication device 26, or more specifically the transmit node 12, described herein (e.g., as described with respect to FIGS. 3 and 4).

Figure 8:
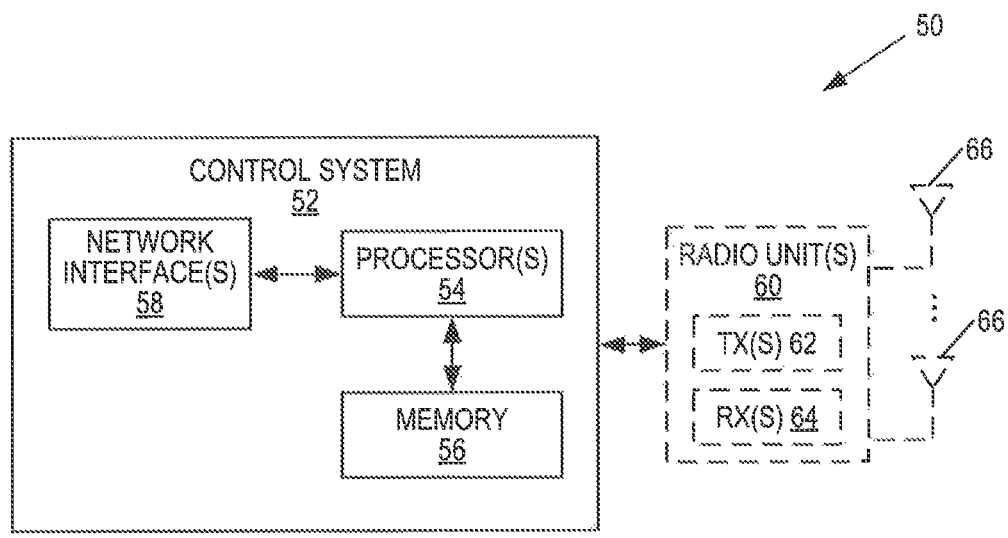
FIGS. 8 through 10 illustrate example embodiments of a network node.

FIG. 8 is a schematic block diagram of a network node 50 (e.g., a radio access node 28 such as, for example, a gNB) according to some embodiments of the present disclosure. As illustrated, the network node 50 includes a control system 52 that includes circuitry comprising one or more processors 54 (e.g., CPUs, ASICs, DSPs, FPGAs, and/or the like) and memory 56. The control system 52 also includes a network interface 58. In embodiments in which the network node 50 is a radio access node 28, the network node 50 also includes one or more radio units 60 that each include one or more transmitters 62 and one or more receivers 64 coupled to one or more antennas 66. In some embodiments, the functionality of the network node 50 (specifically the functionality of the radio access node 28 or transmit node 12) described above may be fully or partially implemented in software that is, e.g., stored in the memory 56 and executed by the processor(s) 54.

Figure 9:
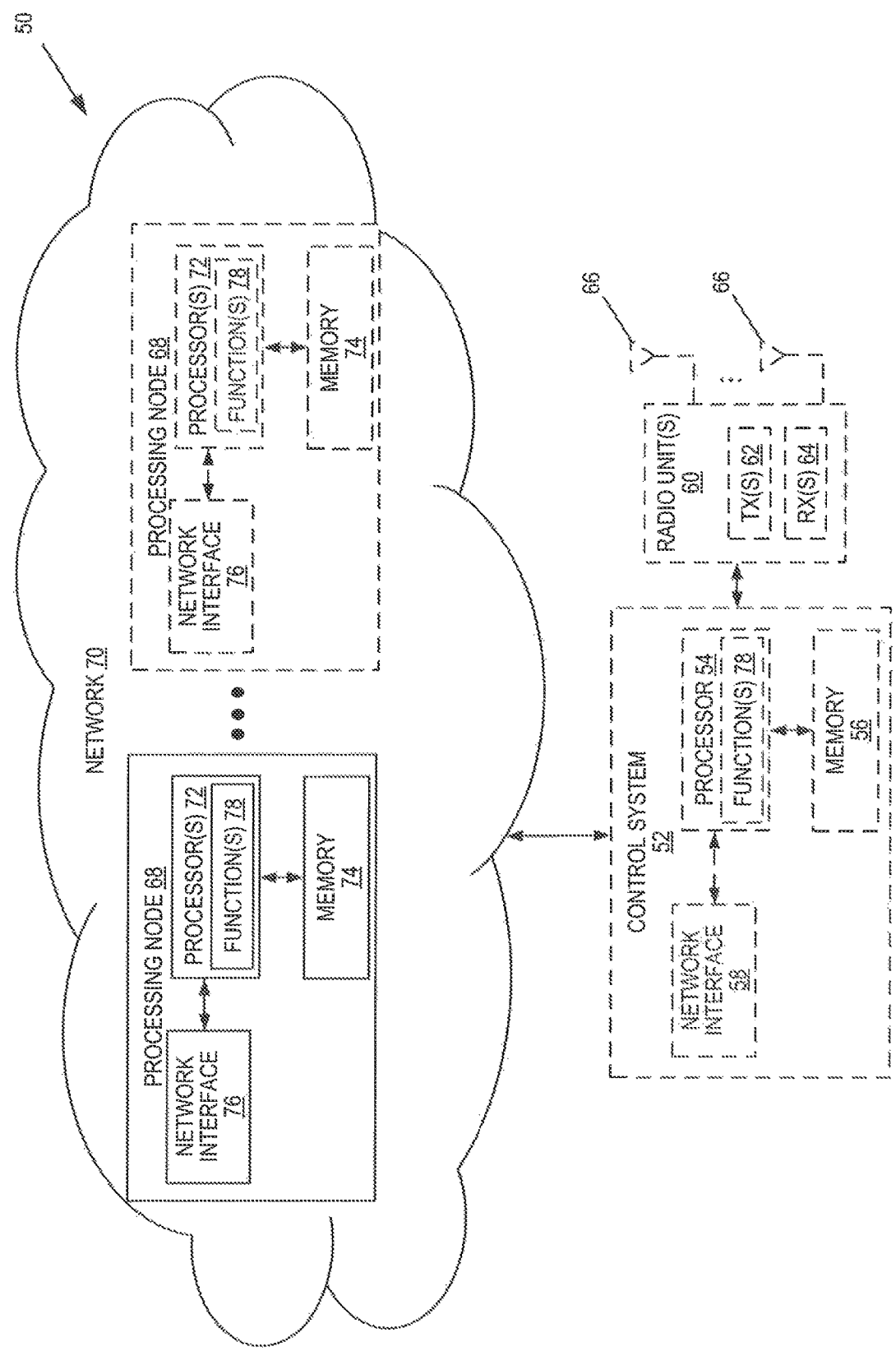

FIG. 9 is a schematic block diagram that illustrates a virtualized embodiment of the network node 50 (e.g., the radio access node 28) according to some embodiments of the present disclosure. As used herein, a "virtualized" network node 50 is a network node 50 in which at least a portion of the functionality of the network node 50 is implemented as a virtual component (e.g., via a virtual machine(s) executing on a physical processing node(s) in a network(s)). As illustrated, the network node 50 optionally includes the control system 52, as described with respect to FIG. 8. In addition, if the network node 50 is the radio access node 28, the network node 50 also includes the one or more radio units 60, as described with respect to FIG. 8. The control system 52 (if present) is connected to one or more processing nodes 68 coupled to or included as part of a network(s) 70 via the network interface 58. Alternatively, if the control system 52 is not present, the one or more radio units 60 (if present) are connected to the one or more processing nodes 68 via a network interface(s). Alternatively, all of the functionality of the network node 50 (e.g., all of the functionality of the radio access node 28) described herein may be implemented in the processing nodes 68. Each processing node 68 includes one or more processors 72 (e.g., CPUs, ASICs, DSPs, FPGAs, and/or the like), memory 74, and a network interface 76.

In this example, functions 78 of the network node 50 (e.g., the functions of the radio access node 28 or transmit node 12) described herein are implemented at the one or more processing nodes 70 or distributed across the control system 52 (if present) and the one or more processing nodes 68 in any desired manner. In some particular embodiments, some or all of the functions 78 of the network node 50 described herein are implemented as virtual components executed by one or more virtual machines implemented in a virtual environment(s) hosted by the processing node(s) 68. As will be appreciated by one of ordinary skill in the art, additional signaling or communication between the processing node(s) 68 and the control system 52 (if present) or alternatively the radio unit(s) 60 (if present) is used in order to carry out at least some of the desired functions. Notably, in some embodiments, the control system 52 may not be included, in which case the radio unit(s) 60 (if present) communicates directly with the processing node(s) 68 via an appropriate network interface (s).

In some particular embodiments, higher layer functionality (e.g., layer 3 and up and possibly some of layer 2 of the protocol stack) of the network node 50 may be implemented at the processing node(s) 68 as virtual components (i.e., implemented "in the cloud") whereas lower layer functionality (e.g., layer 1 and possibly some of layer 2 of the protocol stack) may be implemented in the radio unit(s) 60 and possibly the control system 52.

In some embodiments, a computer program including instructions which, when executed by the at least one processor 54, 72, causes the at least one processor 54, 72 to carry out the functionality of the network node 50 or a processing node 68 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 56, 74).

Figure 10:
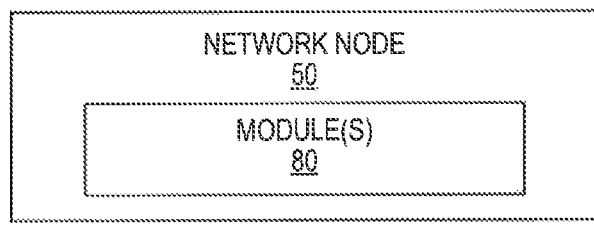

FIG. 10 is a schematic block diagram of the network node 50 (e.g., the radio access node 28) according to some other embodiments of the present disclosure. The network node 50 includes one or more modules 80, each of which is implemented in software. The module(s) 80 provide the functionality of the network node 50 described herein (e.g., the functionality of the transmit node 12 as described herein, e.g., with respect to FIGS. 3 and 4).

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure.

Abbreviations used in the preceding description include:
3GPP Third Generation Partnership Project
5G Fifth Generation
ADC Analog-to-Digital Converter
ASIC Application Specific Integrated Circuit
AWGN Additive White Gaussian Noise
BLER Block Error Rate
CPU Central Processing Unit
CRC Cyclic Redundancy Check
DAC Digital-to-Analog Converter
DSP Digital Signal Processor
eNB Enhanced or Evolved Node B
FPGA Field Programmable Gate Array
gNB New Radio Base Station
LDPC Low-Density Parity-Check
LTE Long Term Evolution
ML Maximum-Likelihood
MME Mobility Management Entity
MTC Machine Type Communication
NR New Radio
P-GW Packet Data Network Gateway
PW Polarization Weight
RX Receive
SC Successive Cancellation
SCEF Service Capability Exposure Function
SCL Successive Cancellation List
TX Transmit
UE User Equipment

The invention claimed is:

1. A method of operation of a transmit node in a wireless communication system, the method comprising:
performing polar encoding of a set of K information bits to thereby generate a set of polar-encoded information bits wherein:
the K information bits are mapped to first K bit locations in an information sequence $S_N$, the information sequence $S_N$ being a ranked sequence of N information bit locations among a plurality of input bits for the polar encoding where N is equivalent to a code length;
a size of the information sequence $S_N$ is greater than or equal to K;
the information sequence $S_N$ is optimized for specific value of the code length (N);
wherein N=128, and the information sequence $S_N$ is:

$S_{128}^1$ = [127 126 125 123 119 111 95 124 63 122 121 118 117 110 115 109 94 107 93 62 103 61 120 91 87 116 114 79 59 108 113 55 106 92 47 102 105 90 31 101 89 86 60 99 85 58 78 57 83 112 54 77 46 53 104 75 51 100 71 45 30 88 43 98 29 84 39 97 27 82 56 76 23 52 15 81 74 50 44 73 70 42 49 69 28 41 67 26 38 96 37 25 22 35 80 21 14 72 19 13 48 68 11 40 7 66 36 24 65 34 20 33 18 12 17 10 6 9 5 64 3 32 16 8 4 2 1 0];

and
transmitting the set of polar-encoded information bits.

2. The method of claim 1, wherein the transmit node is a radio access node in a wireless communication system.

3. The method of claim 1, wherein the transmit node is a wireless communication device in a wireless communication system.

4. A method of operation of a transmit node in a wireless communication system, the method comprising:

performing polar encoding of a set of K information bits to thereby generate a set of polar-encoded information bits wherein:

the K information bits are mapped to first K bit locations in an information sequence $S_N$, the information sequence $S_N$ being a ranked sequence of N information bit locations among a plurality of input bits for the polar encoding where N is equivalent to a code length;

a size of the information sequence $S_N$ is greater than or equal to K;

the information sequence $S_N$ is optimized for specific value of the code length (N);

wherein N=128, and the information sequence $S_N$ is:

| $S_{128}^1 =$ | [0 | 1 | 2 | 4 | 8 | 16 | 32 | 3 | 64 | 5 | 6 |
|---|---|---|---|---|---|---|---|---|---|---|---|
| | 9 | 10 | 17 | 12 | 18 | 33 | 20 | 34 | 65 | 24 | 36 | 66 |
| | 7 | 11 | 40 | 68 | 13 | 19 | 48 | 72 | 14 | 21 | 80 | 35 |
| | 22 | 25 | 37 | 96 | 38 | 26 | 67 | 41 | 28 | 69 | 42 | 49 |
| | 70 | 73 | 44 | 50 | 74 | 81 | 15 | 52 | 23 | 76 | 56 | 82 |
| | 27 | 97 | 39 | 84 | 29 | 98 | 43 | 88 | 30 | 45 | 71 | 100 |
| | 51 | 75 | 104 | 46 | 53 | 77 | 54 | 83 | 57 | 112 | 78 | 58 |
| | 85 | 99 | 60 | 86 | 89 | 101 | 31 | 90 | 105 | 102 | 47 | 92 |
| | 106 | 55 | 113 | 79 | 108 | 59 | 114 | 116 | 87 | 91 | 120 | 61 |
| | 103 | 62 | 93 | 107 | 94 | 109 | 115 | 110 | 117 | 118 | 121 | 122 |
| | 63 | 124 | 95 | 111 | 119 | 123 | 125 | 126 | 127]; | and transmitting the set of polar-encoded information bits.

5. A method of operation of a transmit node in a wireless communication system, the method comprising:

performing polar encoding of a set of K information bits to thereby generate a set of polar-encoded information bits wherein:

the K information bits are mapped to first K bit locations in an information sequence $S_N$, the information sequence $S_N$ being a ranked sequence of N information bit locations among a plurality of input bits for the polar encoding where N is equivalent to a code length;

a size of the information sequence $S_N$ is greater than or equal to K;

the information sequence $S_N$ is optimized for specific value of the code length (N);

wherein N=256, and the information sequence $S_N$ is:

$S_{256}^3$ = [255 254 253 251 247 239 252 223 250 249 246 191 245 238 243 237 127 222 235 221 248 231 219 190 244 189 215 242 126 187 236 241 207 183 234 125 220 175 123 230 233 229 218 119 217 188 214 227 159 186 213 111 240 206 185 211 182 124 205 95 203 232 181 122 174 228 179 121 216 173 118 199 63 226 158 117 171 110 157 212 115 225 167 109 184 155 210 94 204 107 209 180 151 93 202 120 178 103 91 62 201 172 143 198 177 116 61 170 87 197 156 114 108 169 224 195 166 59 113 154 79 55 165 106 153 208 150 92 163 105 47 102 149 90 200 142 31 176 147 101 89 99 60 141 196 86 85 168 58 139 194 112 78 57 83 54 193 164 135 77 152 104 162 53 75 46 148 100 161 51 88 45 146 71 98 140 30 43 145 84 97 138 29 56 82 39 76 137 192 134 27 81 52 74 133 23 50 73 44 15 131 70 49 160 42 69 28 41 96 144 67 38 26 37 25 136 80 22 35 21 132 14 19 72 130 13 48 129 68 11 40 66 7 36 65 24 34 20 33 18 12 17 128 10 9 6 64 5 3 32 16 8 4 2 1 0 ].

and transmitting the set of polar-encoded information bits.

* * * * *